United States Patent
Choi

(10) Patent No.: US 10,902,756 B2
(45) Date of Patent: Jan. 26, 2021

(54) DISPLAY APPARATUS USING SEMICONDUCTOR LIGHT EMITTING DEVICE AND MANUFACTURING METHOD THEREFOR

(71) Applicant: LG ELECTRONICS INC., Seoul (KR)

(72) Inventor: Hwanjoon Choi, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/335,616

(22) PCT Filed: Sep. 22, 2016

(86) PCT No.: PCT/KR2016/010581
§ 371 (c)(1),
(2) Date: Mar. 21, 2019

(87) PCT Pub. No.: WO2018/056477
PCT Pub. Date: Mar. 29, 2018

(65) Prior Publication Data
US 2019/0304346 A1 Oct. 3, 2019

(51) Int. Cl.
| | | |
|---|---|---|
| H01L 25/075 | (2006.01) |
| H01L 51/52 | (2006.01) |
| G02F 1/133 | (2006.01) |
| G03B 21/56 | (2006.01) |
| G02B 5/02 | (2006.01) |
| H01L 27/32 | (2006.01) |
| G09F 9/33 | (2006.01) |
| G09F 9/30 | (2006.01) |
| G09G 3/20 | (2006.01) |

(Continued)

(52) U.S. Cl.
CPC ............... *G09F 9/33* (2013.01); *G09F 9/301* (2013.01); *G09G 3/2003* (2013.01); *G09G 3/32* (2013.01); *H01L 33/00* (2013.01); *H05B 33/12* (2013.01); *H05B 33/22* (2013.01)

(58) Field of Classification Search
CPC ..................... G09F 9/301–33; G09G 3/2003
See application file for complete search history.

(56) References Cited

U.S. PATENT DOCUMENTS

2006/0209413 A1* 9/2006 Kim ............... B82Y 20/00
359/577
2009/0009861 A1* 1/2009 Hyobu ............ G02B 5/0278
359/456

(Continued)

FOREIGN PATENT DOCUMENTS

CN 101688979 A 3/2010
CN 103733243 A 4/2014

(Continued)

*Primary Examiner* — Lin Li
(74) *Attorney, Agent, or Firm* — Birch, Stewart, Kolasch & Birch, LLP

(57) ABSTRACT

The present invention relates to a display apparatus and, particularly, to a display apparatus using a semiconductor light emitting device. A display apparatus according to the present invention has a new type of partition wall structure capable of compensating an adhesive force between a wavelength conversion layer and a color filter in the display apparatus, improving structural reliability while further expanding a filling space of phosphor.

17 Claims, 20 Drawing Sheets

(51) Int. Cl.
  *G09G 3/32* (2016.01)
  *H05B 33/12* (2006.01)
  *H01L 33/00* (2010.01)
  *H05B 33/22* (2006.01)

(56) References Cited

U.S. PATENT DOCUMENTS

2009/0116107 A1* 5/2009 Kindler ................ G03B 21/567
            359/457
2014/0168572 A1   6/2014 Akiko et al.
2014/0368766 A1* 12/2014 Shibata ............. G02F 1/133617
            349/61
2015/0171372 A1*  6/2015 Iwata ....................... C09D 7/41
            257/40
2015/0228865 A1*  8/2015 Rhee ................... H01L 25/0753
            257/90
2015/0362165 A1  12/2015 Chu et al.

FOREIGN PATENT DOCUMENTS

| CN | 105684070 A | 6/2016 | |
|---|---|---|---|
| EP | 3512305 A1 | 7/2019 | |
| JP | 11-54273 A | 2/1999 | |
| JP | 2001-43798 A | 2/2001 | |
| JP | 2003-519072 A | 6/2003 | |
| JP | 2014-57090 A | 3/2014 | |
| JP | WO 2015/083823 A1 * | 6/2015 | ......... H01L 27/3246 |
| KR | 10-2007-0049172 A | 5/2007 | |
| KR | 10-2016-0092398 A | 8/2016 | |

* cited by examiner

DISPLAY APPARATUS USING SEMICONDUCTOR LIGHT EMITTING DEVICE AND MANUFACTURING METHOD THEREFOR

CROSS REFERENCE TO RELATED APPLICATIONS

This application is the National Phase of PCT International Application No. PCT/KR2016/010581, filed on Sep. 22, 2016, which is hereby expressly incorporated by reference into the present application.

FIELD

The present disclosure relates to a display apparatus and a fabrication method thereof, and more particularly, to a flexible display apparatus using a semiconductor light emitting device.

BACKGROUND

In recent years, display apparatuses having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

A structure of exciting light emitted from the semiconductor light emitting device using a wavelength conversion layer and filtering the light with a wavelength of red or green using a color filter may be applicable to the flexible display using the semiconductor light emitting device. In this case, there is a problem that the wavelength conversion layer and the color filter have poor adhesion properties due to differences in physical properties. Therefore, the present disclosure proposes a mechanism for solving such a problem.

SUMMARY

An object of the present disclosure to provide a display apparatus having a new type of partition wall structure capable of compensating an adhesive force between a wavelength conversion layer and a color filter in the display apparatus.

Another object of the present disclosure is to provide a display apparatus capable of improving structural reliability while further expanding a filling space of phosphor.

A display apparatus according to the present disclosure may control a height of a light transmitting material in a partition wall structure to compensate an adhesive force between a wavelength conversion layer and a color filter.

For a specific example, the display apparatus may include a substrate on which wiring electrodes are formed, a plurality of semiconductor light emitting devices electrically connected to the wiring electrodes, a wavelength conversion layer provided with a plurality of phosphor layers that convert a wavelength of light and a plurality of partition wall portions formed between the plurality of phosphor layers, and disposed to cover the plurality of semiconductor light emitting devices, a color filter disposed to cover the wavelength conversion layer; and an adhesive layer disposed between the color filter and the wavelength conversion layer, wherein at least one of the plurality of partition wall portions comprises thin metal layers and a light transmitting material disposed in a space between the thin metal layers, and the adhesive layer is formed to fill at least part of the space between the thin metal layers.

According to an embodiment, at least part of the light transmitting material may be covered by the resin of the phosphor layers. A resin covering at least part of the light transmitting material may overlap with the adhesive layer.

According to an embodiment, at least one of the phosphor layers may be configured to mix phosphor into a resin, and the resin may be formed at a height lower than that of the thin metal layers. The resin may be formed at a height higher than that of the light transmitting material.

Furthermore, a display apparatus of the present disclosure may form a protrusion arrangement on a partition wall structure to structurally further enhance the adhesive force.

A reinforcing portion protruded toward the color filter may be formed on an upper surface of the light transmitting material to reinforce a coupling force between the color filter and the wavelength conversion layer. A recess groove may be formed in the reinforcing portion. The recess groove may have a curved surface concavely formed toward the semiconductor light emitting devices.

At least one of the phosphor layers may be configured to mix phosphor into a resin, and the recess groove may be filled with the resin. The resin may be configured not to be etched by a material for etching the light transmitting material.

According to an embodiment, the reinforcing portion may include a plurality of cylinders. A diameter of the cylinders may be equal to or smaller than a size of the phosphor of the phosphor layers. A pair of the cylinders may be arranged sequentially in one direction to form two rows.

According to an embodiment, the plurality of partition wall portions may include a first partition wall portion disposed to cover between the plurality of semiconductor light emitting devices, and a second partition wall portion configured to cover at least one of the plurality of semiconductor light emitting devices. A reinforcing portion protruded toward the color filter may be formed on an upper surface of a light transmitting material provided on the second partition wall portion, and the reinforcing portion may not be disposed on the first partition wall portion.

In a display apparatus according to the present disclosure, an adhesive layer may fill at least part of a space between thin metal layers of a partition wall portion, thereby securing a space filled with phosphor, and securing adhesion reliability between a wavelength conversion layer and a color filter.

As described above, adhesion reliability may be secured, thereby compensating the weakening of an adhesive force due to a difference in physical properties between a methyl-based Si-based material used as a resin of a phosphor layer and an acrylic-based resin.

Furthermore, through this, it may be possible to mitigate or prevent the occurrence of a separation between a color filter and a partition wall structure due to bending or deterioration.

In addition, according to the present disclosure, a cylindrical shape may be arranged in a partition wall portion, thereby implementing a coupling structure such as a lego assembly. Accordingly, a gap between the color filter and the wavelength conversion layer may be further reduced, thereby improving viewing angle and luminance in the display apparatus.

BRIEF DESCRIPTION OF THE DRAWINGS

The embodiments will be described in detail with reference to the following drawings in which like reference numerals refer to like elements wherein.

DETAILED DESCRIPTION

Figure 1:
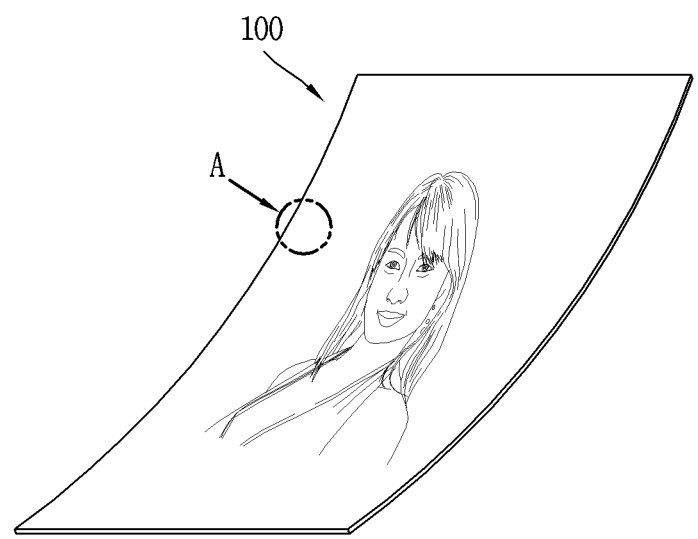
FIG. 1 is a conceptual view illustrating a display apparatus using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display apparatus using a semiconductor light emitting device according to an embodiment of the present disclosure.

According to the drawing, information processed in the controller of the display apparatus 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
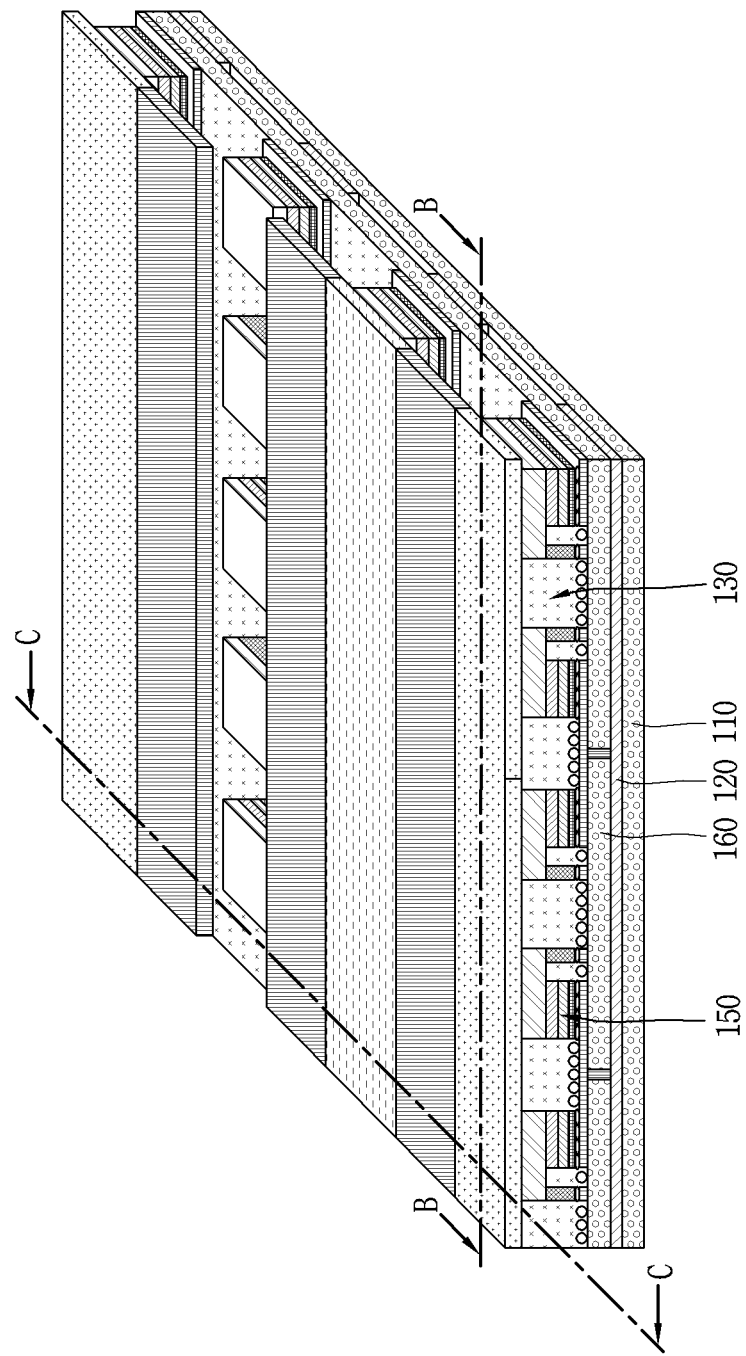
FIG. 2 is a partial enlarged view of portion "A" in FIG. 1, and FIGS. 3A and 3B are cross-sectional views taken along lines B-B and C-C in FIG. 2.
Figure 3A:
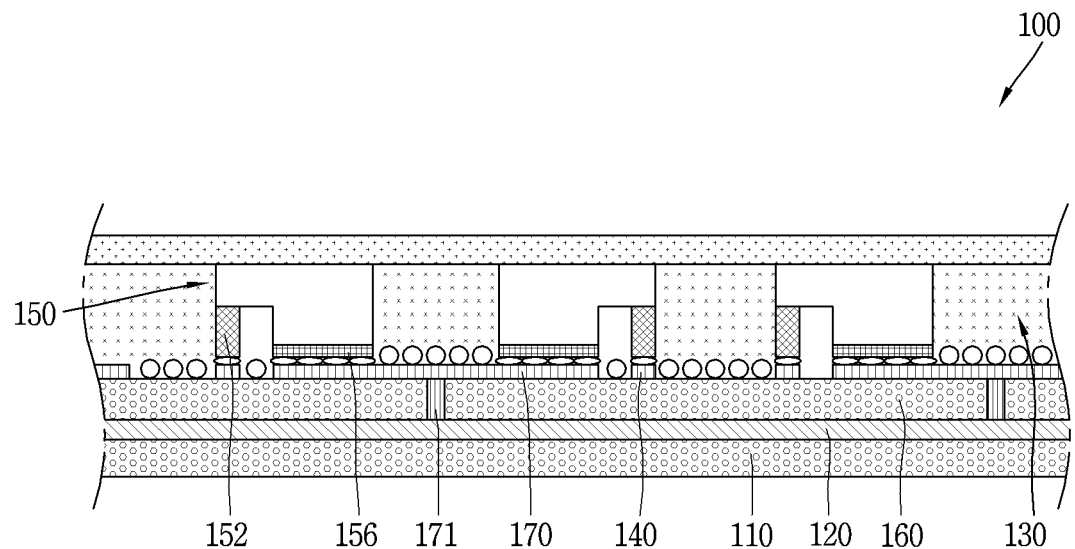
Figure 3B:
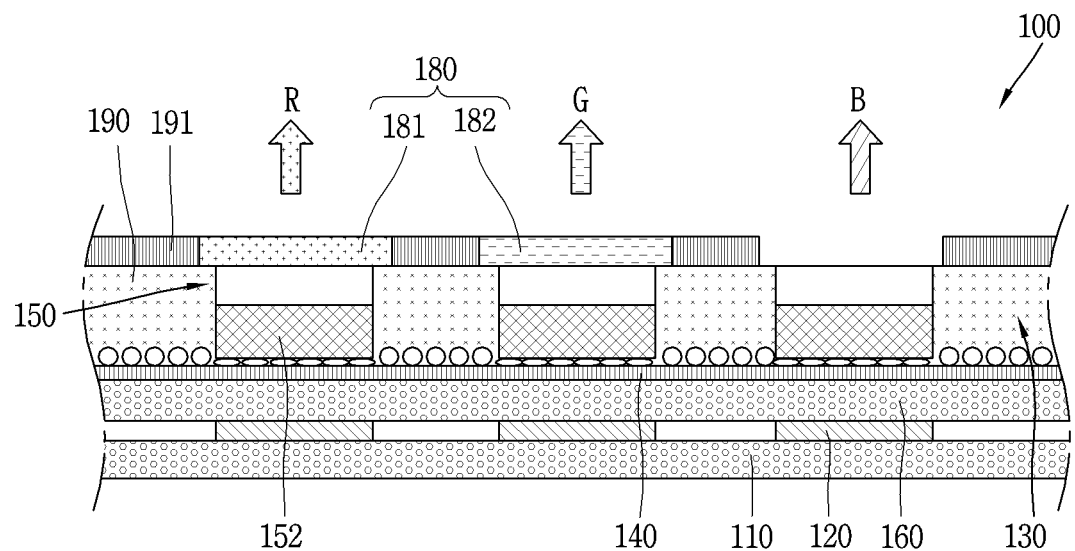
Figure 4:
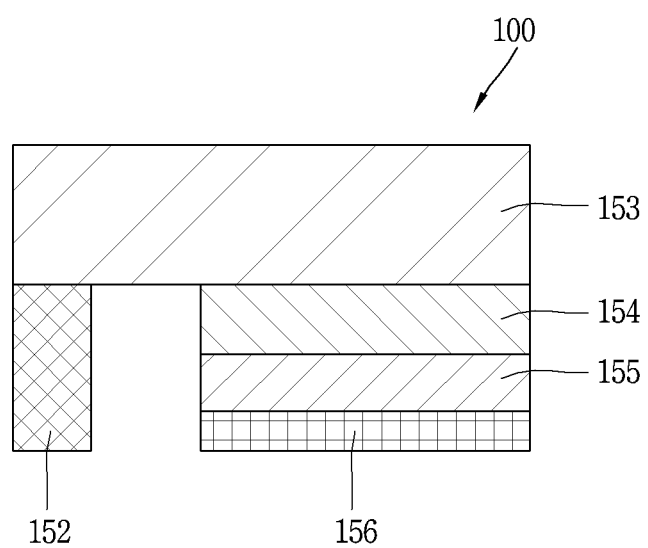
FIG. 4 is a conceptual view illustrating a flip chip type semiconductor light emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display apparatus 100 using a passive matrix (PM) type semiconductor light emitting device as a display apparatus 100 using a semiconductor light emitting device. However, an example described below may also be applicable to an active matrix (AM) type semiconductor light emitting device.

The display apparatus 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display apparatus. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 may form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light-emitting array, and a phosphor layer 180 is formed on the light-emitting array.

The light emitting device array may include a plurality of semiconductor light emitting devices with different self-luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display apparatus. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
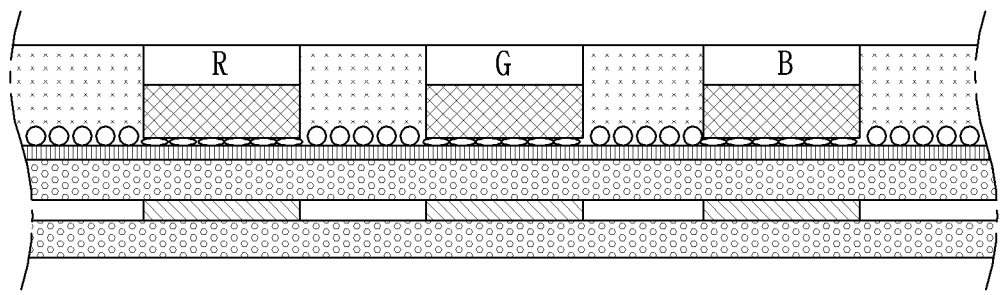
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
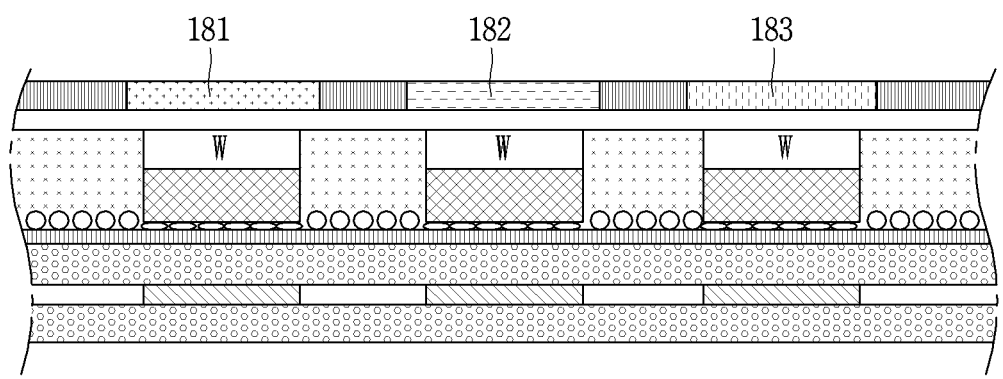

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
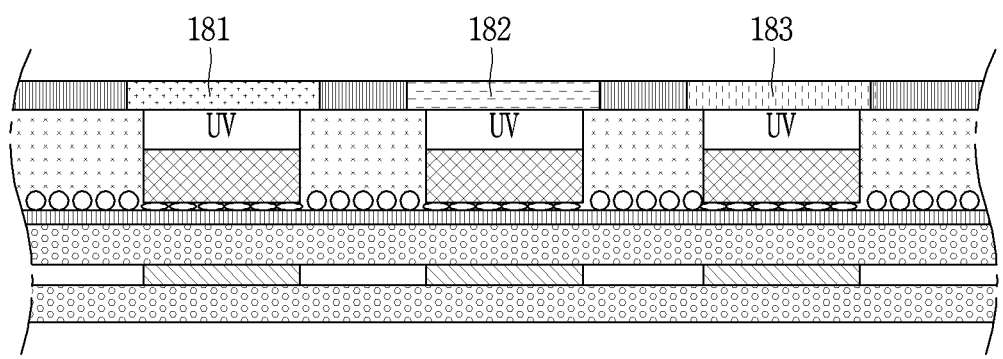

Referring to FIG. 5C, it may be possible to also have a structure in which a red phosphor layer 181, a green phosphor layer 182 and blue phosphor layer 183 may be provided on an ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display apparatus. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display apparatus. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display apparatus having a HD image quality.

A display apparatus using the foregoing semiconductor light emitting device will be fabricated by a new type of fabrication method. Hereinafter, the fabrication method will be described with reference to FIG. 6.

Figure 6:
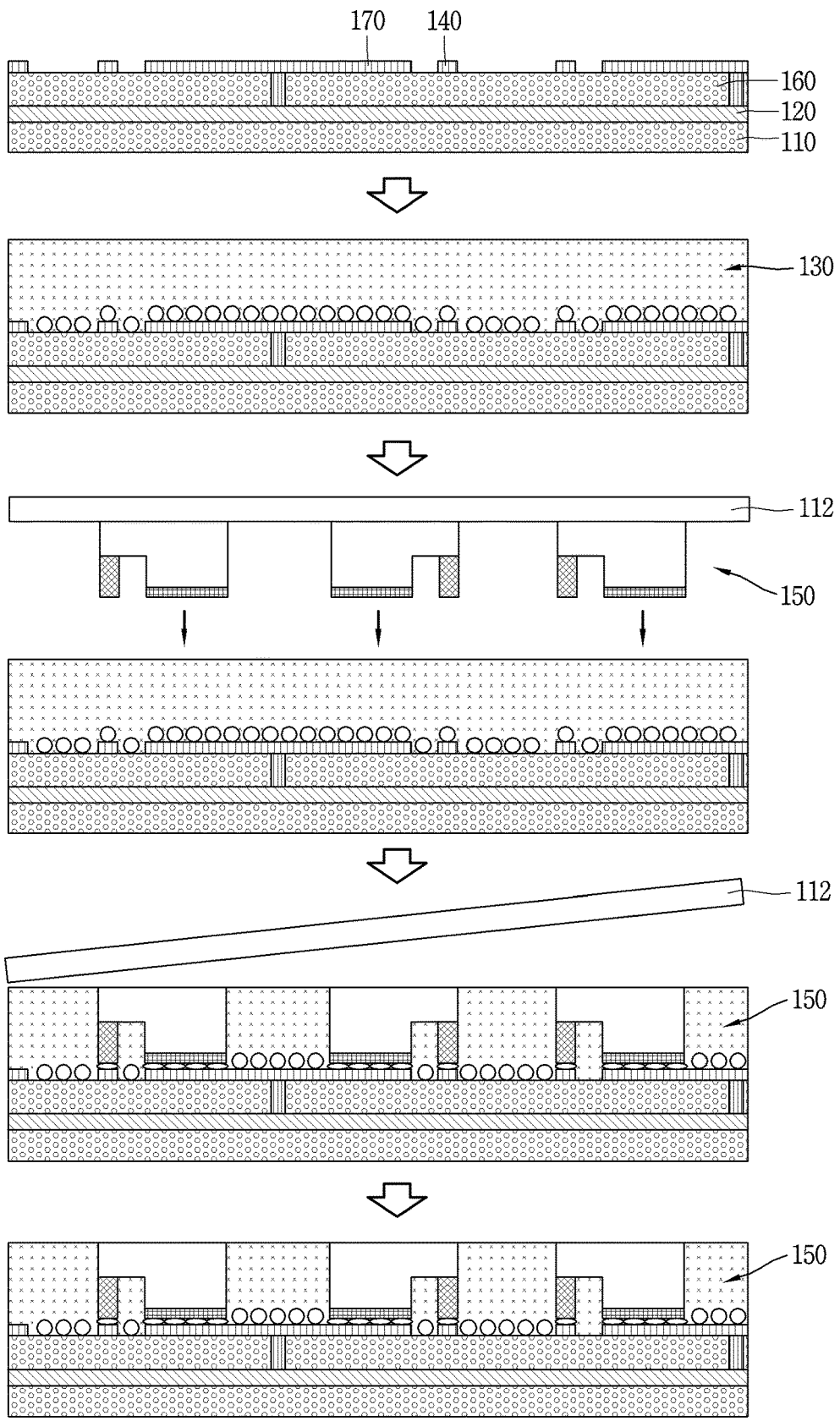
FIG. 6 is cross-sectional views illustrating a fabrication method of a display apparatus using a semiconductor light emitting device according to the present disclosure.

FIG. 6 is cross-sectional views illustrating a fabrication method of a display apparatus using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display apparatus when formed in the unit of wafer, and thus effectively used for a display apparatus.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display apparatus using the foregoing semiconductor light emitting device may be modified in various forms. For such an example, the foregoing display apparatus may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
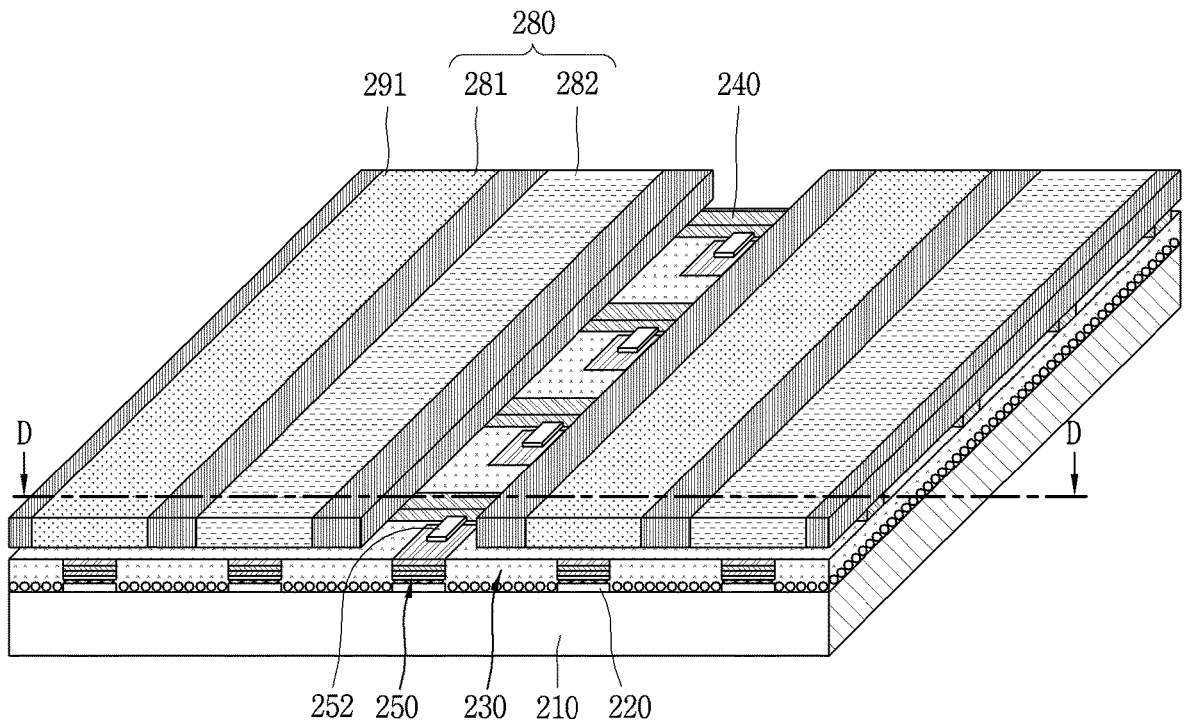
FIG. 7 is a perspective view illustrating a display apparatus using a semiconductor light emitting device according to another embodiment of the present disclosure.
Figure 8:
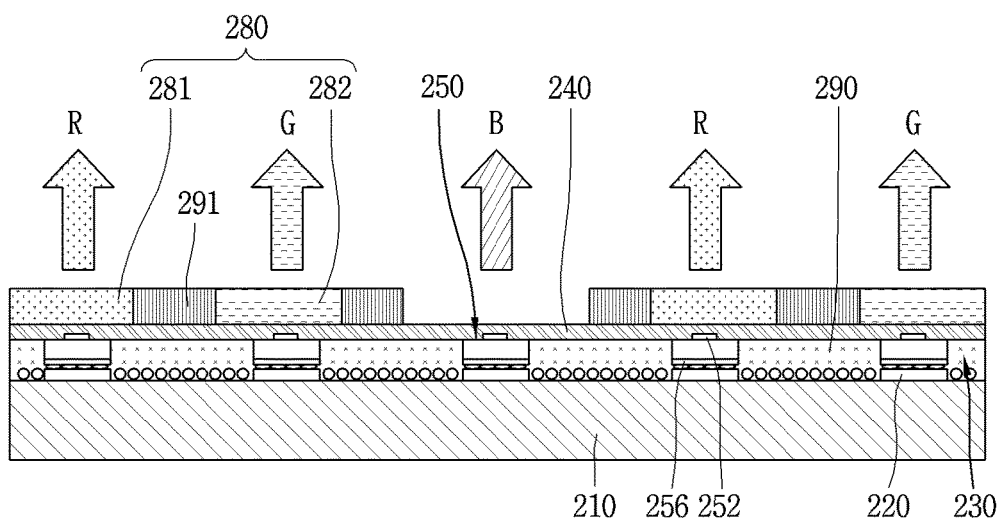
FIG. 8 is a cross-sectional view taken along line D-D in FIG. 7.
Figure 9:
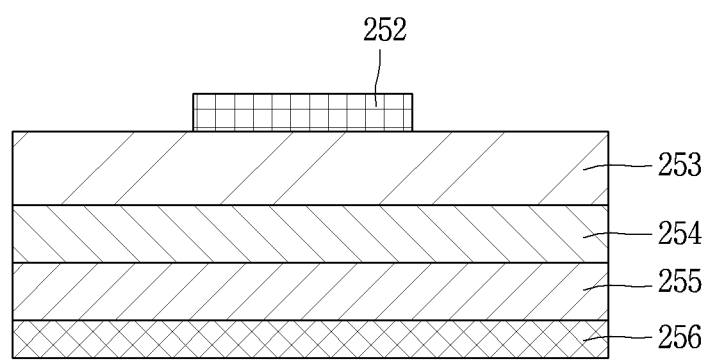
FIG. 9 is a conceptual view illustrating a vertical type semiconductor light emitting device in FIG. 8.

FIG. 7 is a perspective view illustrating a display apparatus using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

According to the drawings, the display apparatus may be display apparatus using a passive matrix (PM) type of vertical semiconductor light emitting device.

The display apparatus may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display apparatus to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display apparatus. The semiconductor light emitting device 250 may have excellent luminance characteristics, and thus it may be possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring again to FIG. 8, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display apparatus.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display apparatus having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting device 250 is located on the conductive adhesive layer 230, thereby constituting individual pixels on the display apparatus. The semiconductor light emitting device 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light emitting device.

In a display apparatus using the foregoing semiconductor light emitting device of the present disclosure, when a flip chip type is applied thereto, the first and second electrodes are disposed on the same plane, thereby causing a problem in which it is difficult to realize a fine pitch. Hereinafter, a display apparatus to which a flip chip type light emitting device according to another embodiment of the present disclosure capable of solving such a problem is applied will be described.

Figure 10:
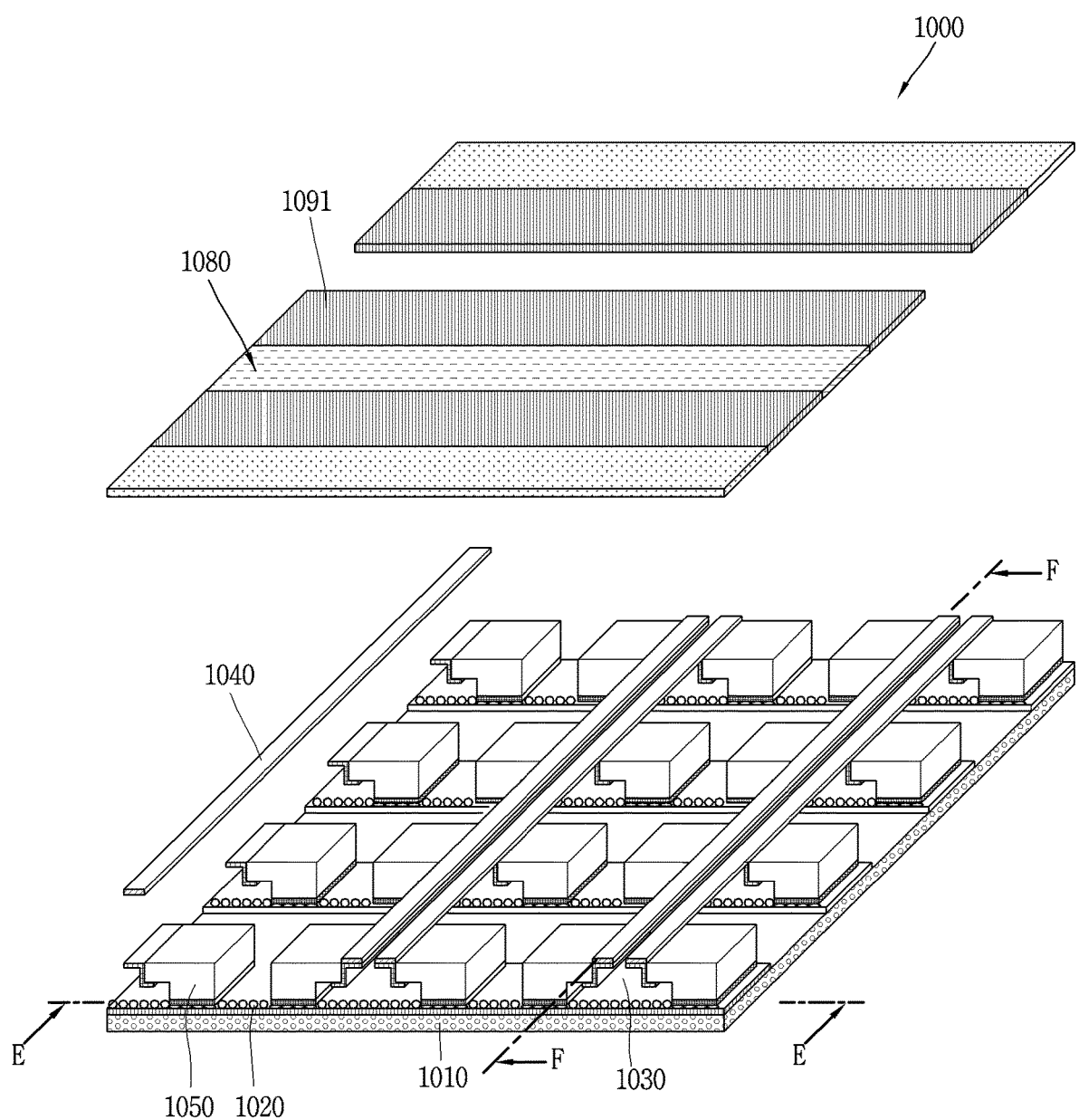
FIG. 10 is an enlarged view of portion "A" in FIG. 1 for explaining another embodiment of the present disclosure to which a semiconductor light emitting device having a new structure is applied.
Figure 11A:
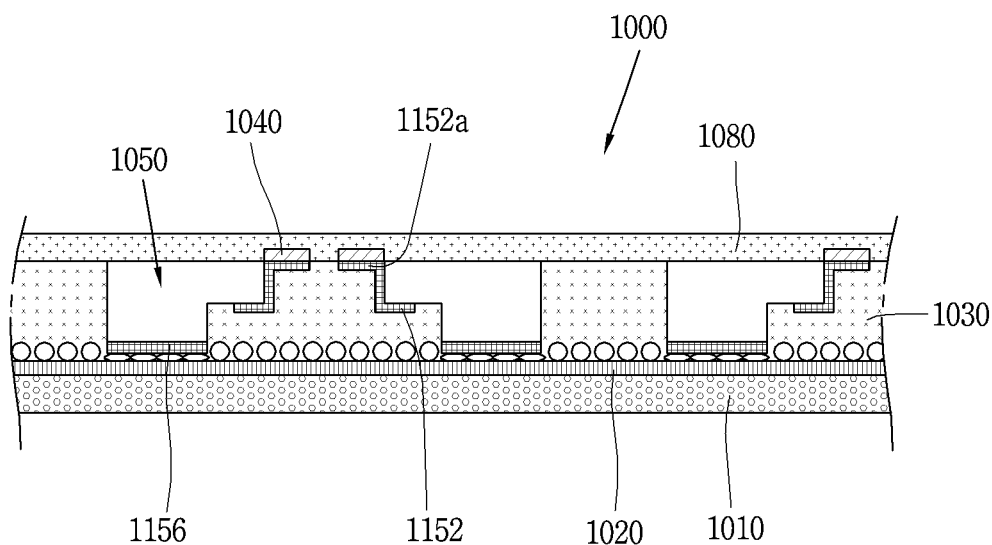
FIG. 11A is a cross-sectional view taken along line E-E in FIG. 10.
Figure 11B:
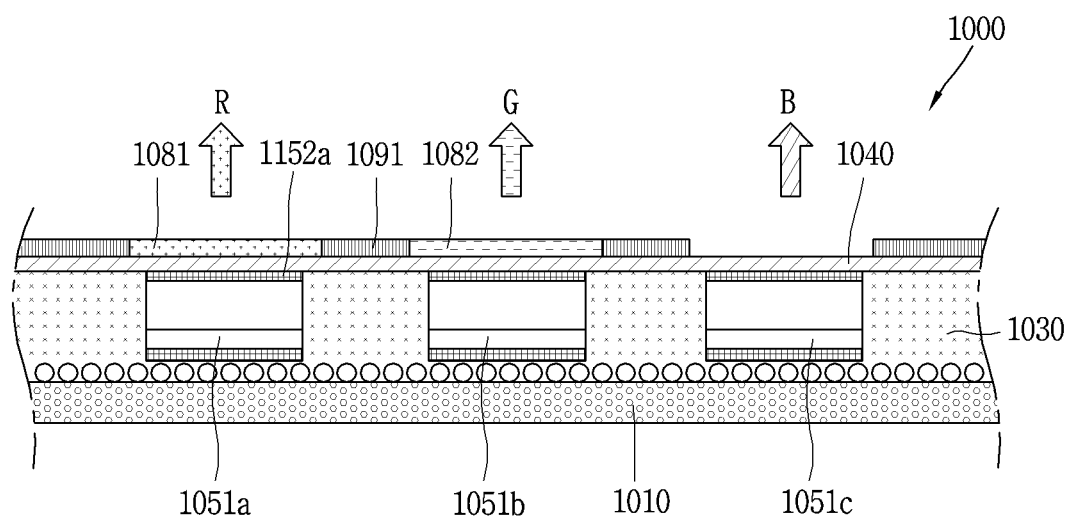
FIG. 11B is a cross-sectional view taken along line F-F in FIG. 11.
Figure 12:
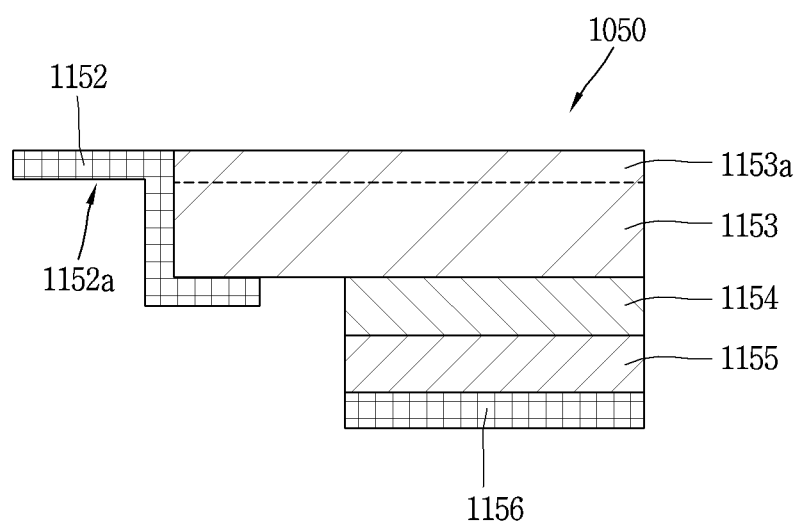
FIG. 12 is a conceptual view illustrating a flip chip type semiconductor light emitting device in FIG. 11A.

FIG. 10 is an enlarged view of portion "A" in FIG. 1 for explaining another embodiment of the present disclosure to which a semiconductor light emitting device having a new structure is applied, FIG. 11A is a cross-sectional view taken along line E-E in FIG. 10, FIG. 11B is a cross-sectional view taken along line F-F in FIG. 11, and FIG. 12 is a conceptual view illustrating a flip chip type semiconductor light emitting device in FIG. 11A.

According to the drawings in FIGS. 10, 11A and 11B, there is illustrated a display apparatus 1000 using a passive matrix (PM) type semiconductor light emitting device as a display apparatus 1000 using a semiconductor light emitting device. However, an example described below may also be applicable to an active matrix (AM) type semiconductor light emitting device.

The display apparatus 1000 may include a substrate 1010, a first electrode 1020, a conductive adhesive layer 1030, a second electrode 1040, and a plurality of semiconductor light emitting devices 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display apparatus. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display apparatus to which the foregoing flip chip type light emitting device is applied, the conductive adhesive layer 1030 may be an anisotropic conductive film (ACF), an anisotropic conductive paste, a solution containing conductive particles, and the like. However, in the present embodiment, the conductive adhesive layer 1030 may be replaced with an adhesive layer. For example, when the first electrode 1020 is not located on the substrate 1010 but formed integrally with the conductive electrode of the semiconductor light emitting device, the adhesive layer may not need to have conductivity.

A plurality of second electrodes 1040 disposed in a direction of crossing the length direction of the first electrode 1020, and electrically connected to the semiconductor light emitting device 1050 may be located between the semiconductor light emitting devices.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected by contact with the semiconductor light emitting device 1050.

A plurality of semiconductor light emitting devices 1050 are coupled to the conductive adhesive layer 1030, and electrically connected to the first electrode 1020 and the second electrode 1040 by the foregoing structure.

According to circumstances, a transparent insulating layer (not shown) containing silicon oxide (SiOx) may be formed on the substrate 1010 formed with the semiconductor light emitting device 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As shown in the drawing, the plurality of semiconductor light emitting devices 1050 may form a plurality of rows in a direction parallel to a plurality of electrode lines provided in the first electrode 1020. However, the present disclosure is not necessarily limited thereto. For example, the plurality of semiconductor light emitting devices 1050 may form a plurality of rows along the second electrode 1040.

Moreover, the display apparatus 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051*a* at a location implementing a red sub-pixel, and a green phosphor 1082 capable of converting blue light into green (G) light may be deposited on the blue semiconductor light emitting device 1051*b* at a location implementing a green sub-pixel. Furthermore, only the blue semiconductor light emitting device 1051*c* may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light emitting device 1050 may be combined with a quantum dot (QD) instead of a phosphor to implement sub-pixels that emit red (R), green (G) and blue (B).

On the other hand, in order to improve the contrast of the phosphor layer 1080, the display apparatus may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light emitting device 1051, but the black matrix 1091 may be respectively formed at both sides thereof by interposing a space that does not have the blue light emitting device 1051*c* therebetween.

Meanwhile, referring to the semiconductor light emitting device 1050 according to the present example, the electrodes may be disposed in an upward/downward direction in the semiconductor light emitting device 1050 in the present embodiment, thereby having a great advantage capable of reducing the chip size. However, the electrode may be disposed on the top and the bottom, but the semiconductor light emitting device may be a flip chip type semiconductor light emitting device.

Referring to FIG. 12, the semiconductor light emitting device 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

More specifically, the first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode is disposed on one surface of the second conductive semiconductor layer 1153, and an undoped semiconductor layer 1153*a* is formed on the other surface of the second conductive semiconductor layer 1153.

Referring to FIG. 12 together with FIGS. 10 through 11B, one surface of the second conductive semiconductor layer may be a surface closest to the wiring substrate, and the other surface of the second conductive semiconductor layer may be a surface farthest from the wiring substrate.

Furthermore, the first conductive electrode 1156 and the second conductive electrode 1152 may have a height difference from each other in width and vertical directions (or thickness direction) at positions spaced apart along the width direction of the semiconductor light emitting device.

The second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 may protrude from a side surface of the second conductive semiconductor layer 1153 (or a side surface of the undoped semiconductor layer 1153*a*). As described above, since the second conductive electrode 1152 protrudes from the side surface, the second conductive electrode 1152 may be exposed to an upper side of the semiconductor light emitting device. Through this, the second conductive electrode 1152 is disposed at a position overlapping the second electrode 1040 disposed at an upper side of the conductive adhesive layer 1030.

More specifically, the semiconductor light emitting device includes a protruding portion 1152*a* extending from the second conductive electrode 1152, and protruding from a side surface of the plurality of semiconductor light emitting devices. In this case, referring to the protruding portion 1152*a* as a reference, the first conductive electrode 1156 and the second conductive electrode 1152 are disposed at positions spaced apart along the protruding direction of the protruding portion 1152a, and may be expressed such that they are formed to have a height difference from each other in a direction perpendicular to the protruding direction.

The protruding portion 1152a extends laterally from one surface of the second conductive semiconductor layer 1153, and extends to an upper surface of the second conductive semiconductor layer 1153, and more specifically, to the undoped semiconductor layer 1153a. The protruding portion 1152a protrudes along the width direction from a side surface of the undoped semiconductor layer 1153a. Accordingly, the protruding portion 1152a may be electrically connected to the second electrode 1040 on the opposite side of the first conductive electrode with respect to the second conductive semiconductor layer.

A structure including the protruding portion 1152a may be a structure capable of using the above-described horizontal semiconductor light emitting device and vertical semiconductor light emitting device. On the other hand, fine grooves may be formed by roughing on an upper surface farthest from the first conductive electrode 1156 on the undoped semiconductor layer 1153a.

According to the above-described display apparatus, light emitted from the semiconductor light emitting devices is excited using phosphors to implement red (R) and green (G). Furthermore, the above-described black matrices 191, 291, 1091 (refer to FIGS. 3B, 8 and 11B) serve as partition walls for preventing color mixing between the phosphors. Accordingly, the present disclosure proposes a new type partition wall structure that allows a structure of a phosphor layer capable of widening a filling space of phosphor or having flexibility, which is different from that of the related art. In addition, the present disclosure also proposes a mechanism capable of compensating an adhesive force between a partition wall structure and a color filter.

Figure 13:
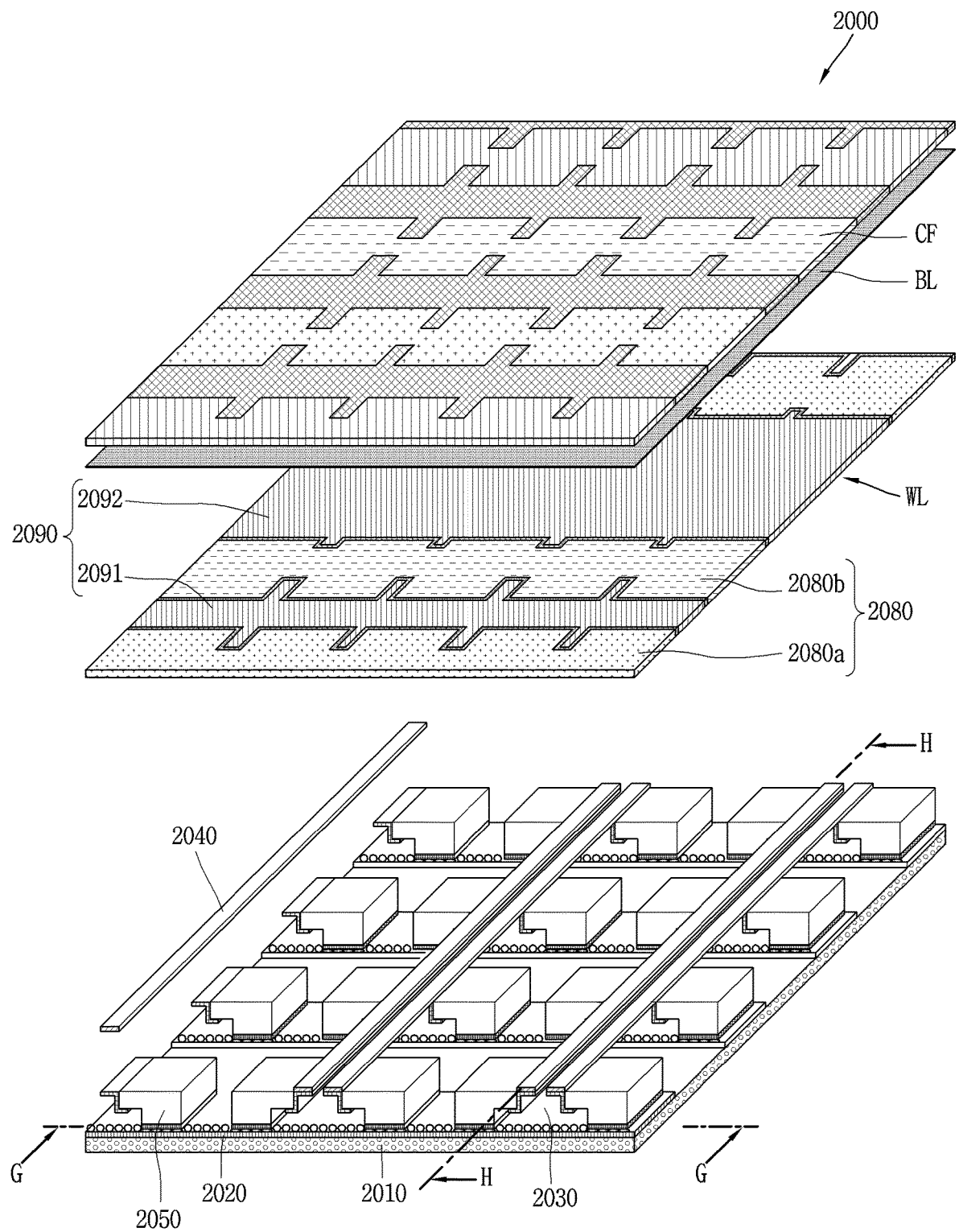
FIG. 13 is an enlarged view of portion "A" in FIG. 1 for explaining another embodiment of the present disclosure.
Figure 14:
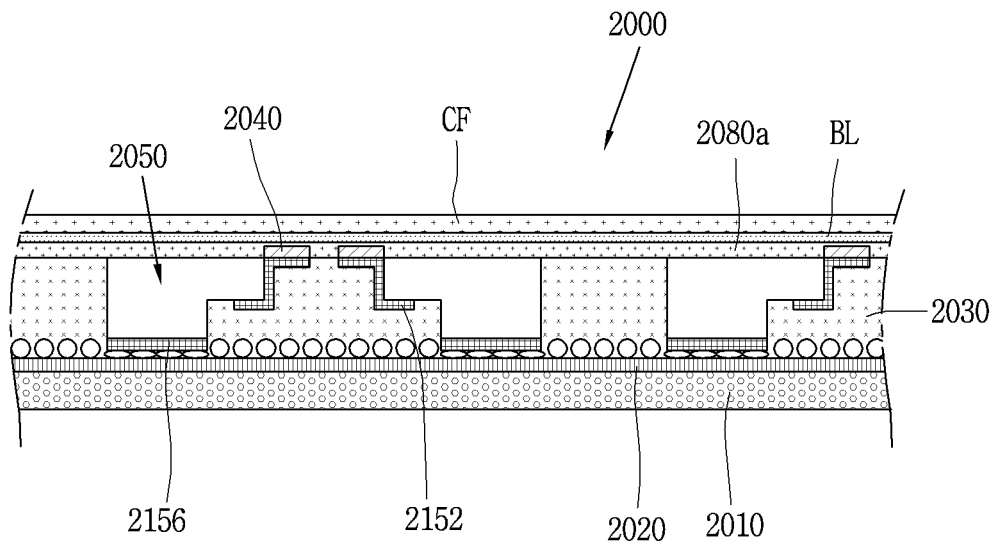
FIG. 14 is a cross-sectional view taken along line G-G in FIG. 13.
Figure 15:
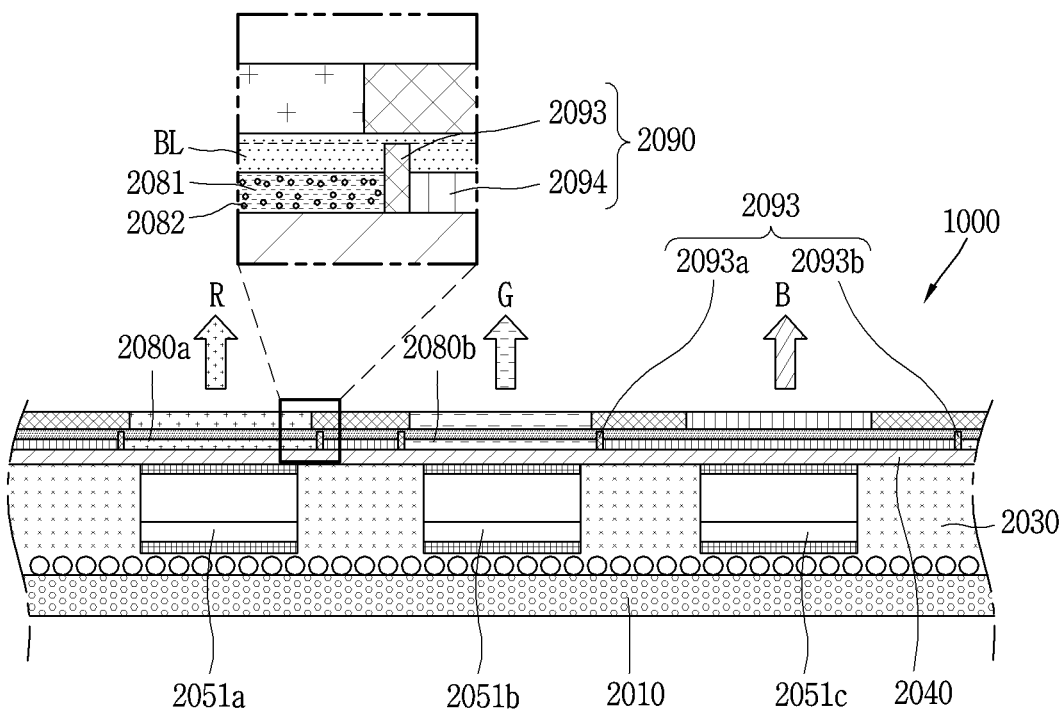
FIG. 15 is a cross-sectional view taken along line H-H in FIG. 13.

Hereinafter, the structure of a display apparatus of the present disclosure will be described in detail with reference to the accompanying drawings. FIG. 13 is an enlarged view of portion "A" in FIG. 1 for explaining another embodiment of the present disclosure, and FIG. 14 is a cross-sectional view taken along line G-G in FIG. 13, and FIG. 15 is a cross-sectional view taken along line H-H in FIG. 13.

According to the drawings in FIGS. 13, 14 and 15, there is illustrated a display apparatus 2000 using flip chip type semiconductor light emitting devices described with reference to FIGS. 10 through 12 display apparatus 1000 as a display apparatus using semiconductor light emitting devices. More specifically, there is illustrated a case in which a new phosphor layer structure is applied to a flip chip type semiconductor light emitting device described with reference to FIGS. 10 through 12. However, an example described below is also applicable to a display apparatus using another type of semiconductor light emitting device described above.

In the present example to be described below, the same or similar reference numerals are designated to the same or similar components as those of the example described above with reference to FIGS. 10 through 12, and the description thereof will be substituted by the earlier description. For example, the display apparatus 2000 includes a substrate 2010, a first electrode 2020, a conductive adhesive layer 2030, a second electrode 2040, and a plurality of semiconductor light emitting devices 2050, and the descriptions thereof will be substituted by the description with reference to FIGS. 10 through 12 as described above. Therefore, in the present embodiment, the conductive adhesive layer 2030 may be replaced with an adhesive layer, and a plurality of semiconductor light emitting devices may be attached to the adhesive layer disposed on the substrate 2010, and the first electrode 2020 may be integrally formed with a conductive electrode of the semiconductor light emitting device without being located on the substrate 2010.

The second electrode 2040 may be located on the conductive adhesive layer 2030. In other words, the conductive adhesive layer 2030 is disposed between the wiring substrate and the second electrode 2040. The second electrode 2040 may be electrically connected by contact with the semiconductor light emitting device 2050.

As described above, the display apparatus 2000 may include a wavelength conversion layer (WL) disposed to cover a plurality of semiconductor light emitting devices 2050. For example, the semiconductor light emitting device 2050 is a blue semiconductor light emitting device that emits blue (B) light, and the wavelength converting layer (WL) performs the role of converting the blue (B) light into the color of a sub-pixel or converting the blue (B) light into yellow or white color.

According to the drawings, the wavelength conversion layer (WL) includes a plurality of phosphor layers 2080 that convert a wavelength of light and a plurality of partition wall portions 2090 formed between the plurality of phosphor layers 2080.

The plurality of phosphor layers 2080 may include a red phosphor layer 2080a having red phosphor and a green phosphor layer 2080b having green phosphor. In other words, a red phosphor layer 2080a capable of converting blue light into red (R) light may be deposited on the blue semiconductor light emitting device 2051a at a location implementing a red pixel, and a green phosphor layer 2080b capable of converting blue light into green (G) light may be deposited on the blue semiconductor light emitting device 2051b at a location implementing a green pixel.

On the other hand, one partition wall portion 2090 is disposed between the red phosphor layer 2080a and the green phosphor layer 2080b. In this case, at least one of the plurality of partition wall portions 2090 overlaps with at least one of the plurality of semiconductor light emitting devices along a thickness direction of the phosphor layer 2080. Furthermore, at least one of the plurality of partition wall portions 2090 is configured to transmit light along the thickness direction of the phosphor layer 2080. More specifically, one partition wall portion 2091 is disposed on the blue semiconductor light emitting device 2051c in a portion constituting a blue pixel, and light emitted from the blue semiconductor light emitting device 2051c is transmitted to the outside without any conversion of color.

In this case, a phosphor layer or a partition wall portion may be formed along each line of the first electrode 2020. Accordingly, one line on the first electrode 2020 may be an electrode controlling one color. Furthermore, red (R), green (B) and blue (B) may be sequentially disposed along the second electrode 2040, thereby implementing sub-pixels. However, the present disclosure may not be necessarily limited to this, and quantum dot (GD) instead of phosphor may be filled into the phosphor layer to implement sub-pixels that emit red (R), green (G) and blue (B).

On the other hand, according to the illustration, a color filter (CF) is disposed to cover the wavelength conversion layer (WL). More specifically, the color filter (CF) and the wavelength conversion layer (WL) may be combined by an adhesive layer (BL). For example, as the adhesive layer (BL) is disposed between the color filter (CF) and the wavelength conversion layer (WL), the color filter (CF) may be adhered to the wavelength conversion layer (WL).

In this case, the color filter (CF) is configured to selectively transmit light to implement red, green and blue colors. The color filter (CF) may be provided with respective portions for filtering a red wavelength, a green wavelength, and a blue wavelength, and each of the portions to have a structure in which the respective portions are repeatedly arranged. At this time, a portion for filtering red and a portion for filtering green may be disposed at an upper side of the red phosphor layer 2080a and the green phosphor layer 2080b, and a portion for filtering blue may be disposed to cover the partition wall portion 2091 at a portion forming a blue pixel. A black matrix may be disposed between the filtering portions.

In this case, the phosphor layer 2080 and the partition wall portion 2090 are combined with the color filter (CF) to implement the unit pixels of red, green, and blue.

For another example, all the phosphor layers may be filled with yellow phosphor other than red or green phosphor, and color filters (CFs) repeated with red, green, and blue may be arranged to cover the phosphor layer 2080.

On the other hand, the plurality of partition wall portions 2090 may include a first partition wall portion 2091 and a second partition wall portion 2092.

The first partition wall portion 2091 is disposed to cover a space between the plurality of semiconductor light emitting devices. Accordingly, at least part of the plurality of phosphor layers 2080 is disposed with the first partition 2091 therebetween. In this case, the at least part of the phosphor layers 2080 may include at least one of red phosphor, green phosphor, and yellow phosphor. More specifically, the first partition 2091 is located at a portion where a blue pixel is not disposed in a space between the red phosphor layer 2080a and the green phosphor layer 2080b that are repeatedly formed. Therefore, the semiconductor light emitting device is not disposed under the first partition wall portion 2091.

Meanwhile, the second partition wall portion 2092 is configured to cover at least one of the plurality of semiconductor light emitting devices. In this case, at least one of the plurality of semiconductor light emitting devices covered by the second partition wall portion 2092 includes the blue semiconductor light emitting device 2051c. In other words, the second partition wall portion 2092 is located at a portion where a blue pixel is not disposed in a space between the red phosphor layer 2080a and the green phosphor layer 2080b that are repeatedly formed. Therefore, the blue semiconductor light emitting device 2051c is disposed under the second partition wall portion 2092.

In order to implement the foregoing structure, the first partition wall portion 2091 and the second partition wall portion 2092 are respectively formed in a unit pixel that emits red (R), green (G), and blue (B). Furthermore, the first partition wall portion 2091 and the second partition wall portion 2092 may be formed to have different widths (W) formed along a direction perpendicular to the thickness direction of the phosphor layer 2080. In this case, the width of the first partition wall portion 2091 is formed smaller than that of the second partition wall portion 2092. The width of the second partition wall portion 2092 is greater than or equal to that of the semiconductor light emitting device 2050, and thus the width of the first partition wall portion 2091 is greater than that of the semiconductor light emitting device 2050.

In this case, the width of the second partition wall portion 2092 may be a distance (less than) from a width (distance between both ends) of an isolated blue semiconductor light emitting device 2051c to an end portion of an isolated blue semiconductor light emitting device 2051a corresponding to a red pixel (Or less) to an end portion of an isolated blue semiconductor light emitting device 2051b corresponding to a green pixel. Furthermore, a width of the phosphor layer 2080 may be formed to be greater than that of the semiconductor light emitting device 2050.

According to the illustration, only two partition wall portions exist in a unit pixel, and the width of one of the two (for example, the first partition wall portion) becomes smaller, and thus the width of the phosphor layer 2080 may be further increased. As described above, since the width of the phosphor layer 2080 is increased, a filling space of the phosphor layer may be secured more than that of the related art, and thus the amount of phosphor to be filled may be further increased.

Describing the structure of the partition wall portions 2090 in more detail with reference to FIGS. 14 and 15, at least one of the plurality of partition wall portions 2090 is provided with one or more thin metal layers 2093 formed at edges thereof, and a light transmitting material 2094 is filled into a space between the thin metal layers 2093.

The light transmitting material 2094 is a material having a high transmittance in a visible light region, and an epoxy-based PR (photoresist), PDMS (polydimethylsiloxane), resin or the like may be used, for example. These materials are suitable for use as a material for a partition wall portion applied to a flexible display, since they do not have a property of being rigid at high temperatures.

For example, the thin metal layers 2093 are configured to cover a side surface of the phosphor layer 2080 to reflect light.

The thin metal layers 2093 may include a first thin metal layer 2093a disposed at one side edge of the partition wall portions 2090 and a second thin metal layer 2093b disposed at the other side edge. The first thin metal layer 2093a and the second thin metal layer 2093b may each have a thickness of 50 to 1000 nanometers. More specifically, the first thin metal layer 2093a and the second thin metal layer 2093b may each have a thickness of 100 to 200 nanometers.

The thin metal layers 2093 do not exist at upper and lower ends of the partition wall portion. In other words, the first thin metal layer 2093a and the second thin metal layer 2093b are separated from each other along the width direction of the partition wall portion. Through this structure, light transmitted through the light transmitting material may be output from an upper end of the partition wall portion to the outside.

The first thin metal layer 2093a and the second thin metal layer 2093b are formed of a metal material such as aluminum or silver having a high reflectance in the visible light region to reflect light, thereby preventing color mixture between the phosphor layers. However, the present disclosure is not be necessarily limited thereto, and, for example, the thin metal layer may be replaced with an oxide thin film such as TiOx or CrOx, or a distribute Bragg reflector (DBR) structure may be applicable thereto.

The thin metal layers 2093 are formed of a single thin metal layer as illustrated in the drawing, but the present disclosure is not necessarily limited thereto. For example, the thin metal layers 2093 may be formed of a multilayer thin metal layer. For another example, an insulating film may be formed between the thin metal layer 2093 and the light transmitting material. The insulating layer may be formed of an opaque material such as $SiO_2$, $SiN_x$, or the like. For another example, the insulating film may be a black matrix. In this case, the black matrix may exhibit an additional effect of improving the contrast.

On the other hand, the adhesive layer (BL) disposed between the color filter (CF) and the wavelength conversion layer (WL) may be formed to fill at least part of a space between the thin metal layers 2093. In order to implement such a structure, a height of the light transmitting material 2094 in the partition wall portion may be adjusted, thereby compensating for an adhesive force between the wavelength conversion layer (WL) and the color filter (CF).

More specifically, the light transmitting material 2094 may be formed at a lower height than the thin metal layers 2093. Here, the height may be defined as a distance from the semiconductor light emitting device or the conductive adhesive layer. Since the light transmitting material 2094 is lower in height than the thin metal layers 2093, a portion not disposed with the light transmitting material 2094 is formed in a space between the thin metal layers 2093, and an adhesive material of the adhesive layer (BL) is filled into the portion not disposed with the light transmitting material. According to such a structure, the adhesive material fills at least part of a space between the thin metal layers 2093, and thus the adhesion space may be increased to compensate an adhesive force between the wavelength conversion layer (WL) and the color filter (CF).

Moreover, at least part of an upper surface of the phosphor layer 2080 may be formed at a lower height than the thin metal layers 2093. Therefore, a thickness of the adhesive layer (BL) covering a portion having a height lower than that of the thin metal layers 2093 on the upper surface of the phosphor layer 2080 may be increased.

More specifically, at least one of the phosphor layers 2080 may be configured to mix phosphor 2082 into a resin 2081, and the resin 2081 may be formed at a height lower than that of the thin metal layers 2093. In this case, the resin 2081 may be a methyl-based Si-based resin.

According to the illustration, the resin 2081 is formed at a height higher than that of the light transmitting material 2094, but an upper surface of the resin 2081 is concavely recessed toward the semiconductor light emitting device, and a thickness of the adhesive layer (BL) at the relevant portion is increased. For example, since the resin is filled in a space between the thin metal layers in a state having fluidity and then cured, a central portion of the resin located away from the thin metal layers may be recessed downward. At this time, the recessed portion is filled with an adhesive material, and thus an adhesive force between the wavelength conversion layer (WL) and the color filter (CF) may be further enhanced.

In the above, a structure capable of compensating an adhesion force of the color filter (CF) while increasing a filling space of phosphor through a new structure of the wavelength conversion layer (WL) has been described. On the other hand, an adhesive force of the color filter (CF) may be further increased by the modification of the wavelength conversion layer (WL), and this structure will be described below in more detail.

Figure 16:
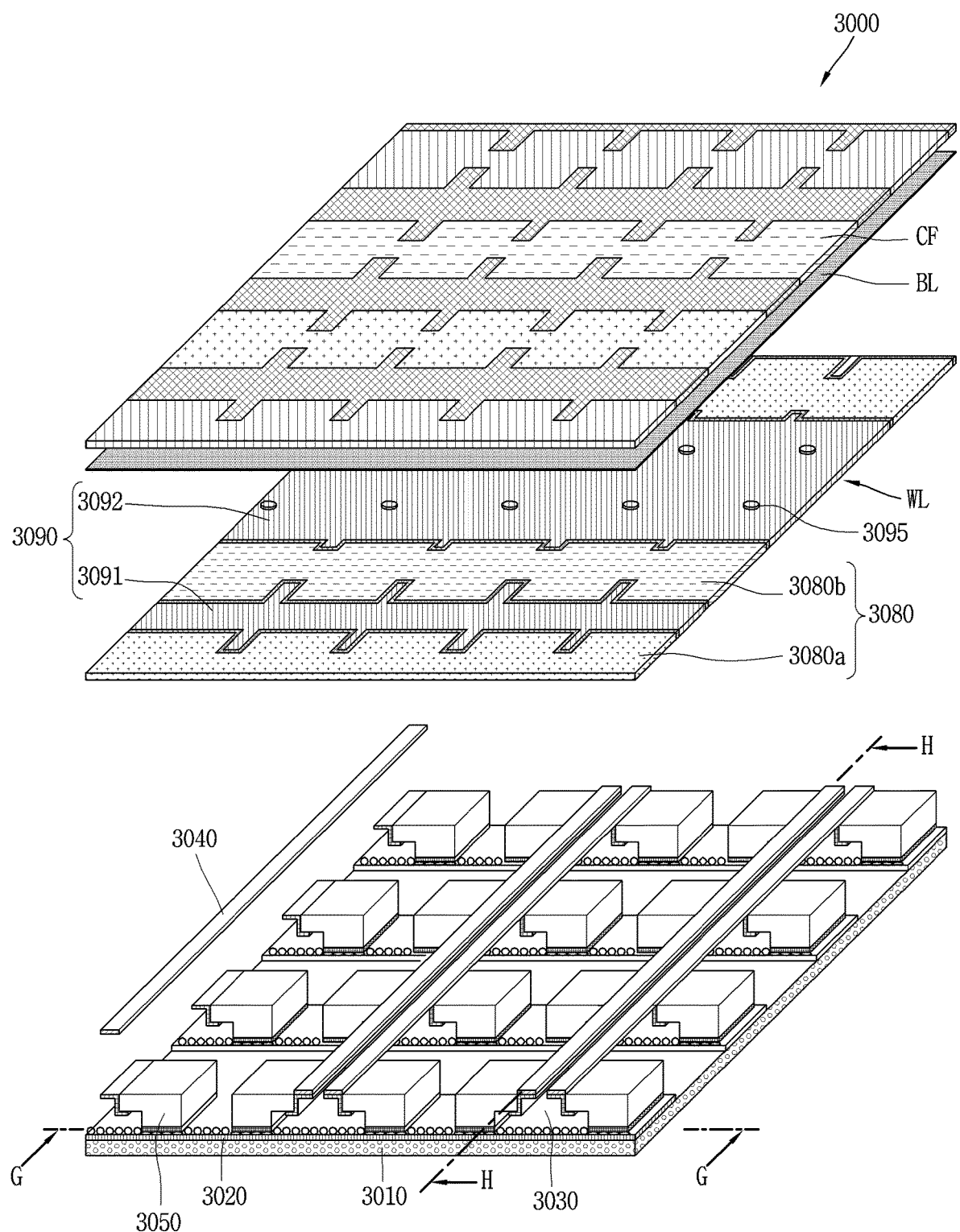
FIGS. 16 and 17 are a cross-sectional view and a plan view respectively showing a modified example of partition portions in FIG. 15.
Figure 17:
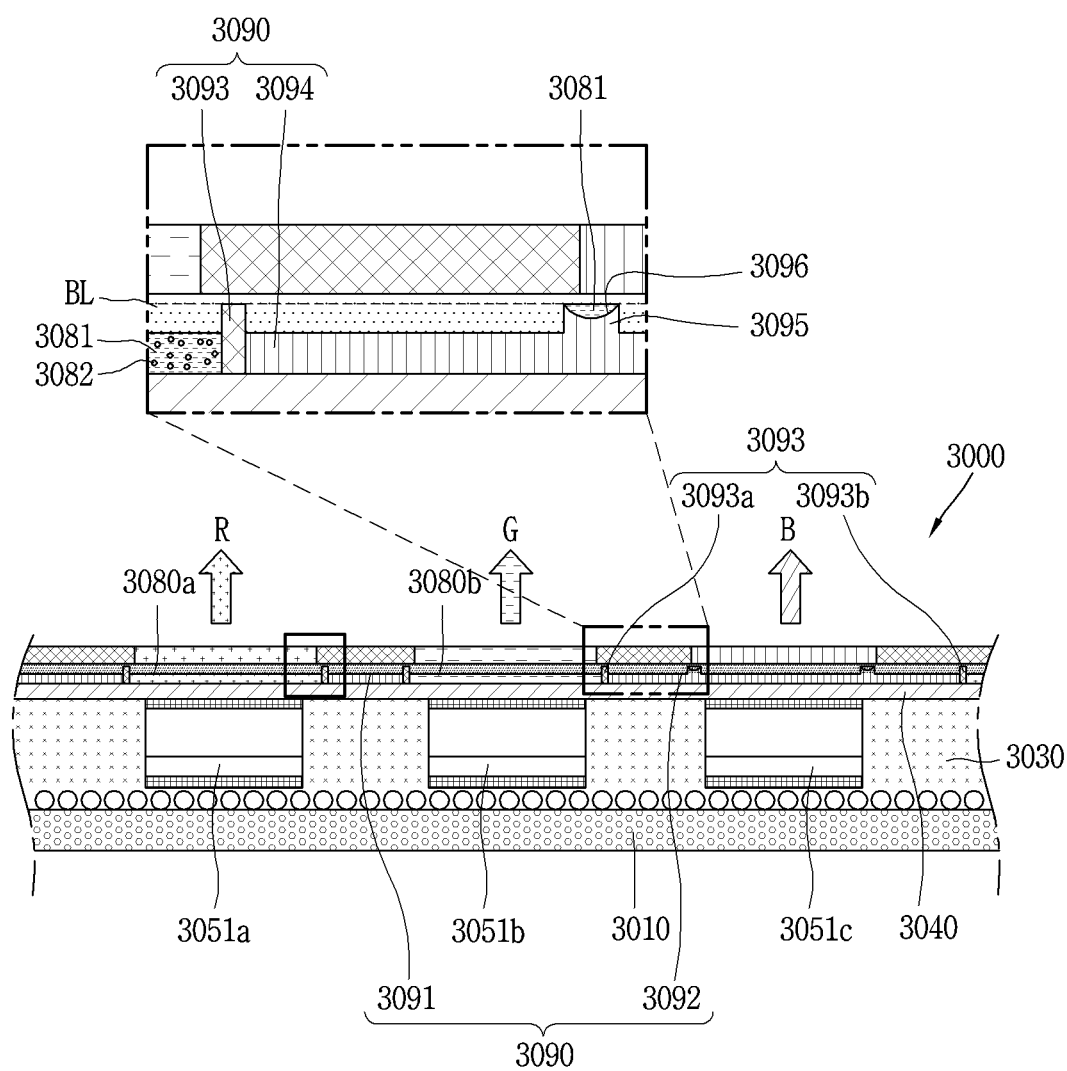

FIGS. 16 and 17 are a cross-sectional view and a plan view respectively showing a modified example of the wavelength conversion layer in FIG. 13.

In the present example to be described below, the same or similar reference numerals are designated to the same or similar components as those of the example described above with reference to FIGS. 13 through 15, and the description thereof will be substituted by the earlier description. For example, the display apparatus 3000 includes a substrate 3010, a first electrode 3020, a conductive adhesive layer 3030, a second electrode 3040, a plurality of semiconductor light emitting devices 3050, and a color filter (CF), and the descriptions thereof will be substituted by the description with reference to FIGS. 13 through 15 as described above.

As shown in the foregoing embodiment, a display apparatus 3000 includes a wavelength conversion layer (WL) disposed to cover a plurality of semiconductor light emitting devices 3050, and the wavelength conversion layer (WL) includes a plurality of phosphor layers 3080 that convert a wavelength of light and a plurality of partition wall portions 3090 formed between the plurality of phosphor layers 3080.

The plurality of phosphor layers may have the same configuration as the phosphor layers of the foregoing example, and therefore, the description thereof will be substituted by the description with reference to FIGS. 13 through 15.

In this case, at least one of the plurality of partition wall portions 3090 overlaps with at least one of the plurality of semiconductor light emitting devices along a thickness direction of the phosphor layer 3080. Furthermore, at least one of the plurality of partition wall portions 3090 is configured to transmit light along the thickness direction of the phosphor layer 3080. More specifically, one partition wall portion 3091 is disposed on the blue semiconductor light emitting device 3051c in a portion constituting a blue pixel, and light emitted from the blue semiconductor light emitting device 3051c is transmitted to the outside without any conversion of color.

More specifically, the plurality of partition wall portions 3090 may include a first partition wall portion 3091 and a second partition wall portion 3092.

The first partition wall portion 3091 is disposed to cover a space between the plurality of semiconductor light emitting devices. Accordingly, at least part of the plurality of phosphor layers 3080 is disposed with the first partition 3091 therebetween. In this case, the at least part of the phosphor layers 3080 may include at least one of red phosphor, green phosphor, and yellow phosphor. More specifically, the first partition 3091 is located at a portion where a blue pixel is not disposed in a space between the red phosphor layer 3080a and the green phosphor layer 3080b that are repeatedly formed. Therefore, the semiconductor light emitting device is not disposed under the first partition wall portion 3091.

Meanwhile, the second partition wall portion 3092 is configured to cover at least one of the plurality of semiconductor light emitting devices. In this case, at least one of the plurality of semiconductor light emitting devices covered by the second partition wall portion 3092 includes the blue semiconductor light emitting device 3051c. In other words, the second partition wall portion 3092 is located at a portion where a blue pixel is not disposed in a space between the red phosphor layer 3080a and the green phosphor layer 3080b that are repeatedly formed. Therefore, the blue semiconductor light emitting device 3051c is disposed under the second partition wall portion 3092.

In order to implement the foregoing structure, the first partition wall portion 3091 and the second partition wall portion 3092 are respectively formed in a unit pixel that emits red (R), green (G), and blue (B). Furthermore, the first partition wall portion 3091 and the second partition wall portion 3092 may be formed to have different widths (W) formed along a direction perpendicular to the thickness direction of the phosphor layer 3080. In this case, the width of the first partition wall portion 3091 is formed smaller than that of the second partition wall portion 3092. The width of the second partition wall portion 3092 is greater than or equal to that of the semiconductor light emitting device 3050, and thus the width of the first partition wall portion 3091 is greater than that of the semiconductor light emitting device 3050.

Describing the structure of the partition wall portions 3090 in more detail with reference to the drawings, at least one of the plurality of partition wall portions 3090 is provided with one or more thin metal layers 3093 formed at edges thereof, and a light transmitting material 3094 is filled into a space between the thin metal layers 3093.

The light transmitting material 3094 is a material having a high transmittance in a visible light region, and an epoxy-based PR (photoresist), PDMS (polydimethylsiloxane), resin or the like may be used, for example.

The thin metal layers 3093 may include a first thin metal layer 3093a disposed at one side edge of the partition wall portions 3090 and a second thin metal layer 3093b disposed at the other side edge. The thin metal layers 3093 do not exist at upper and lower ends of the partition wall portion. In other words, the first thin metal layer 3093a and the second thin metal layer 3093b are separated from each other along the width direction of the partition wall portion.

Meanwhile, referring to the drawings, the adhesive layer (BL) may be formed to fill at least part of a space between the thin metal layers. In order to implement such a structure, a height of the light transmitting material in the partition wall portion may be adjusted, thereby compensating for an adhesive force between the wavelength conversion layer (WL) and the color filter (CF).

Moreover, a reinforcing portion 3095 protruded toward the color filter may be formed on an upper surface of the light transmitting material to further compensate the adhesive force. In this case, the reinforcing portion 3095 may be protruded toward the color filter (CF) from an upper surface of the light transmitting material 3094 provided in the second partition wall portion 3092, and the reinforcing portion may not be disposed on the first partition wall portion 3091.

At this time, the light transmitting material 3094 is etched to be reduced in height, and a height of the resin 3081 of the phosphor layer 3080 corresponding to the red and green pixels may be formed to be lower than the height of the reinforcing portion 3095. For such an example, there may be a height difference of about 10 micrometers or less.

More specifically, a pair of reinforcing portions are disposed apart from each other on an upper surface of the light transmitting material 3094. At this time, a gap between the reinforcing portions may be 1.5 to 5 times larger than a thickness of the reinforcing portion 3095. For example, an arrangement gap between the reinforcing portions 3095 may be at least 1.5 times a diameter of the reinforcing portion 3095.

For example, the reinforcing portion 3095 may be formed of a plurality of cylinders. At this time, a diameter of the cylinders may be formed to be equal to or smaller than a size of phosphor 3082 of the phosphor layers 3080. For example, a diameter of the cylinder is similar to a size of the phosphor 3082, but may be a small size of about 2 micrometers.

As shown in the illustration, a plurality of pairs may be sequentially arranged along one direction such that the cylinders form a plurality of rows. For an example, a pair of the cylinders may be arranged along one direction so as to form two rows. As described above, a cylindrical shape may be arranged on an upper surface of the light transmitting material 3094 in the partition wall portions 3090, thereby implementing a coupling structure such as a lego assembly.

Furthermore, the partition wall portion of the present example proposes a new structure capable of easily fabricating the reinforcing portion 3095. For example, at least part of the light transmitting material 3094 may be formed to be covered by the resin 3081 of the phosphor layers 3080.

More specifically, at least one of the phosphor layers 3080 may be configured to mix phosphor 3082 into a resin 3081, and the resin 3081 may be formed at a height lower than that of the thin metal layers 3093. The resin 3081 is configured not to be etched by a material for etching the light transmitting material 3094, and thus the light transmitting material 3094 may be etched except for the portion covered by the resin 3081. Through this, the cylinder may be formed, and the detailed fabrication process will be described later. In this case, the resin covering at least part of the light transmitting material 3094 overlaps with the adhesive layer (BL).

More specifically, a recess groove 3096 is formed on the reinforcing portion 3095, and the resin 3081 of the phosphor layer 3080 may be filled in the recess groove 3096. The recess groove 3096 has a curved surface concavely formed toward the semiconductor light emitting devices. The resin 3081 is made of a methyl-based Si-based resin so as not to be etched by a material for etching the light transmitting material 3094, and disposed in the recess groove 3096 to cover the curved surface. As described above, the resin 3081 of the phosphor layer 3080 may be filled in a bowl shape on an upper surface of the cylinder.

According to the structure described above, a gap between the color filter (CF) and the wavelength conversion layer (WL) may be reduced on the assumption that an adhesive material of the adhesive layer (BL) has the same volume, thereby improving luminance and color gamut in the display apparatus.

According to the new phosphor layer structure as described above, a partition wall portion suitable for a display having a flexible characteristic may be realized. Hereinafter, a fabrication method of forming a new phosphor layer structure as described above will be described in detail with reference to the accompanying drawings. FIGS. 18A, 18B, 18C, 18D, 18E, 18F and 18G are cross-sectional views showing a method of fabricating a display apparatus using a semiconductor light emitting device of the present disclosure.

Figure 18A:
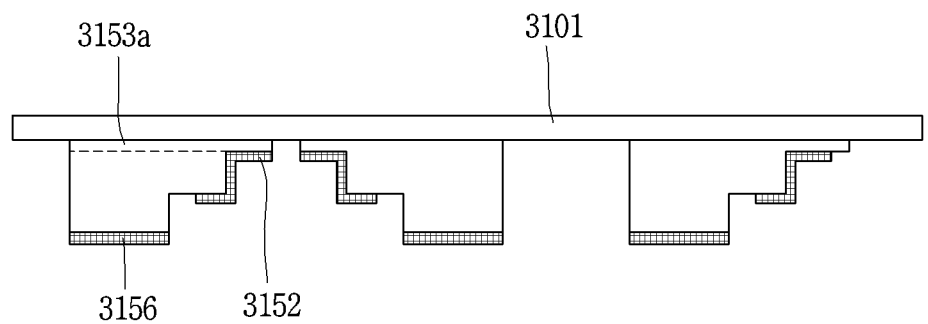
FIGS. 18A, 18B, 18C, FIGS. 19A, 19B, 19C, 19D, 19E, 19F and 19G are cross-sectional views showing a method of fabricating a display apparatus using a semiconductor light emitting device of the present disclosure.

First, according to the fabrication method, the process of coupling a plurality of semiconductor light emitting devices to a substrate is carried out. For example, a first conductive semiconductor layer, an active layer, and a second conductive semiconductor layer are grown on a growth substrate, and each semiconductor light emitting device is produced through etching, and then a first conductive electrode 3156 and a second conductive electrode 3152 are formed (FIG. 18A).

The growth substrate 2101 (wafer) may be formed of any one of materials having light transmission properties, for example, sapphire ($Al_2O_3$), GaN, ZnO, and AlO, but is not limited thereto. Furthermore, the growth substrate 3101 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

The first conductive electrode and the first conductive semiconductor layer may be a p-type electrode and a p-type semiconductor layer, respectively, and the second conductive electrode 3152 and the second conductive semiconductor layer may be an n-type electrode and an n-type semiconductor layer, respectively. However, the present disclosure is not limited thereto, and the first conductive type may be n-type and the second conductive type may be p-type.

In this case, as described above, at least part of the second conductive electrode 3152 protrudes from a side surface of the second conductive semiconductor layer (or a side surface of the undoped semiconductor layer 3153a).

Figure 18B:
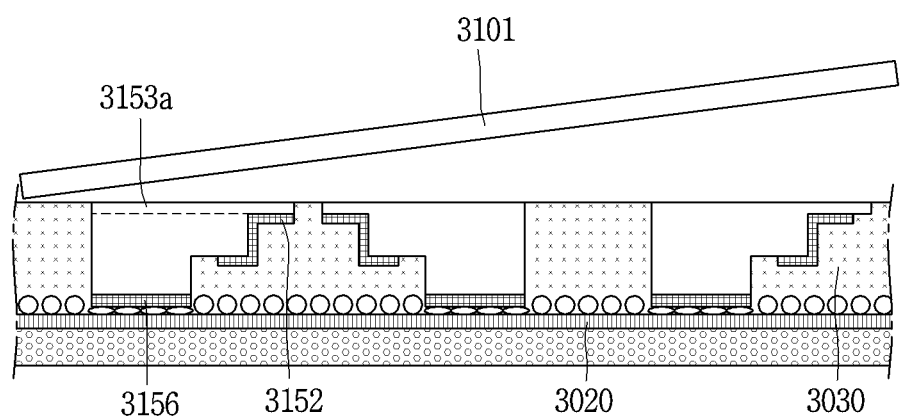
Figure 18C:
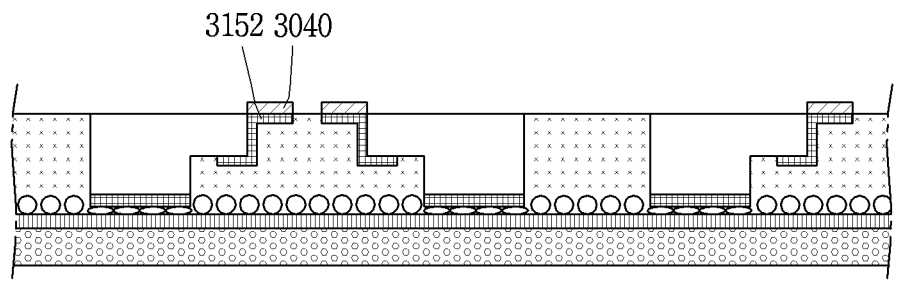

Next, the flip chip type light emitting device is coupled to the wiring substrate using the conductive adhesive layer 3030, and the growth substrate is removed (FIG. 18B).

The wiring substrate is in a state where the first electrode 3020 is formed, and the first electrode 3020 is electrically connected to the first conductive electrode 3156 by a conductive ball or the like within the conductive adhesive layer 3030 as lower wiring.

Figure 19A:
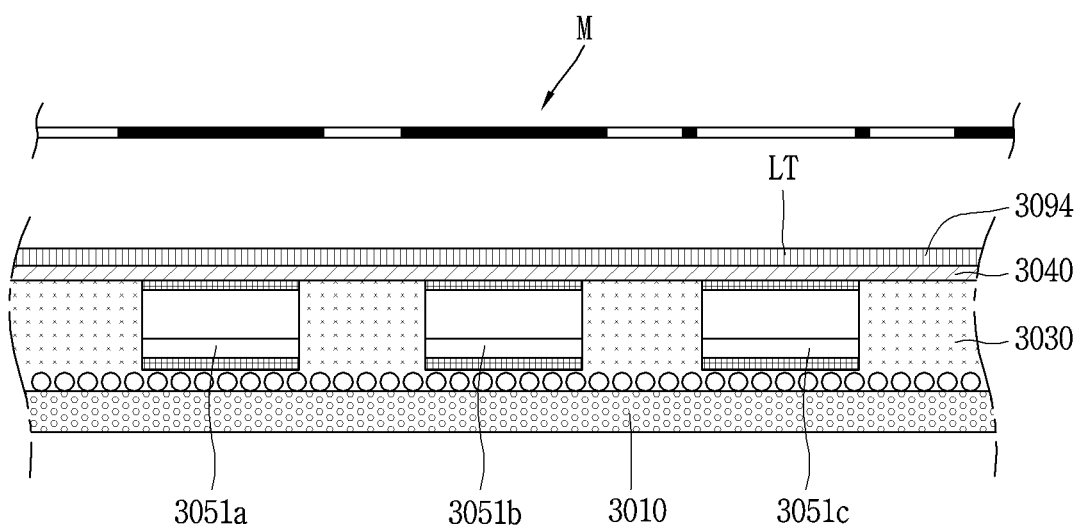
Figure 19B:
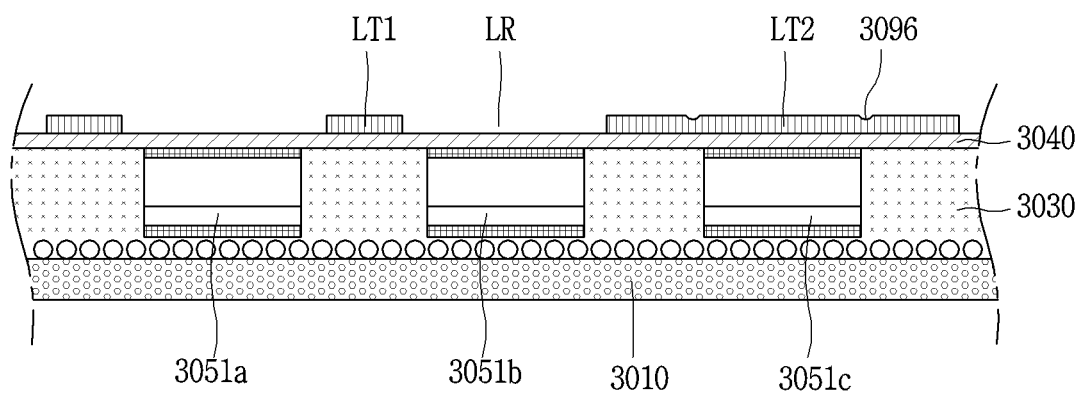
Figure 19C:
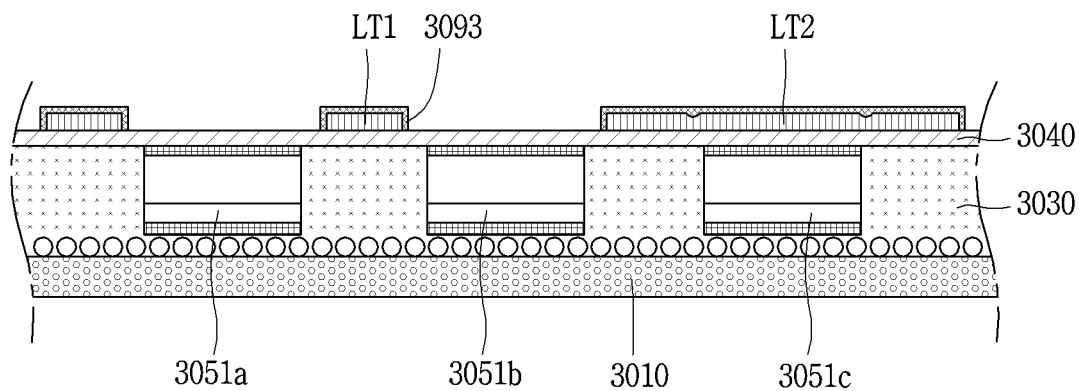

Then, the undoped semiconductor layer 3153a is etched and removed, a second electrode 3040 connecting the protruded second conductive electrode 3152 is formed (FIG. 19C). The second electrode 3040 is directly connected to the second conductive electrode 3152 as upper wiring.

However, the present disclosure is not necessarily limited to this, and the undoped semiconductor layer may be replaced with another type of absorbing layer that absorbs UV laser energy. The absorbing layer may be a buffer layer, and formed in a low-temperature atmosphere, and made of a material capable of alleviating a difference in lattice constant with respect to the semiconductor layer and the growth substrate. For example, the absorbing layer may include materials such as GaN, InN, AlN, AlInN, InGaN, AlGaN, and InAlGaN.

Next, a wavelength conversion layer (WL) disposed to cover the plurality of semiconductor light emitting devices is formed. According to the illustration, the wavelength conversion layer (WL) includes a plurality of phosphor layers 2080 that convert a wavelength of light and a plurality of partition wall portions 2090 formed between the plurality of phosphor layers 2080. In this case, at least one of the plurality of partition wall portions overlaps with at least one of the plurality of semiconductor light emitting devices along a thickness direction of the phosphor layer.

According to the illustration, first, the process of forming a partition wall portion may be carried out. Referring to FIG. 19A, a light transmitting material (LT) is applied to the plurality of semiconductor light emitting devices.

The light transmitting material (LT) is a material having a high transmittance in a visible light region, and an epoxy-based PR (photoresist), PDMS (polydimethylsiloxane), resin or the like may be used, as described above.

Then, the process of etching the light transmitting material using a mask pattern (M) and filling phosphor in a portion (LR) on which the light transmitting material (LT) is etched to produce the phosphor layers and the partition wall portions is carried out.

More specifically, referring to FIG. 19B, the light transmitting material (LT) is etched, and in this case, the light transmitting material (LT) is not etched at a portion corresponding to at least one of the plurality of semiconductor light emitting devices. In other words, by the etching, the light transmitting material (LT) may be partitioned into a portion (LT1) disposed to cover a space between the plurality of semiconductor light emitting devices, and a portion (LT2) disposed to cover at least one of the plurality of semiconductor light emitting devices.

At this time, at least one groove may be formed on an upper surface of the portion (LT2) disposed to cover at least one of the plurality of semiconductor light emitting devices. For this purpose, a micro mask pattern may be formed on the relevant portion during the etching. Light is refracted into an inside of the partition wall portion by diffraction due to the micro mask pattern during an exposure process, and the groove may be formed through the refraction.

Referring to FIG. 19C, the process of etching the light transmitting material, and then depositing a thin metal layer 3093 on the light transmitting material (LT) is carried out. In this case, the thin metal layer 3093 may be deposited on the entire outer surface of the light transmitting material (LT) using a deposition technique or using a sputter process. As described above, the thin metal layer may be formed of a metal material such as aluminum or silver having a good reflectance in the visible light region.

Figure 19D:
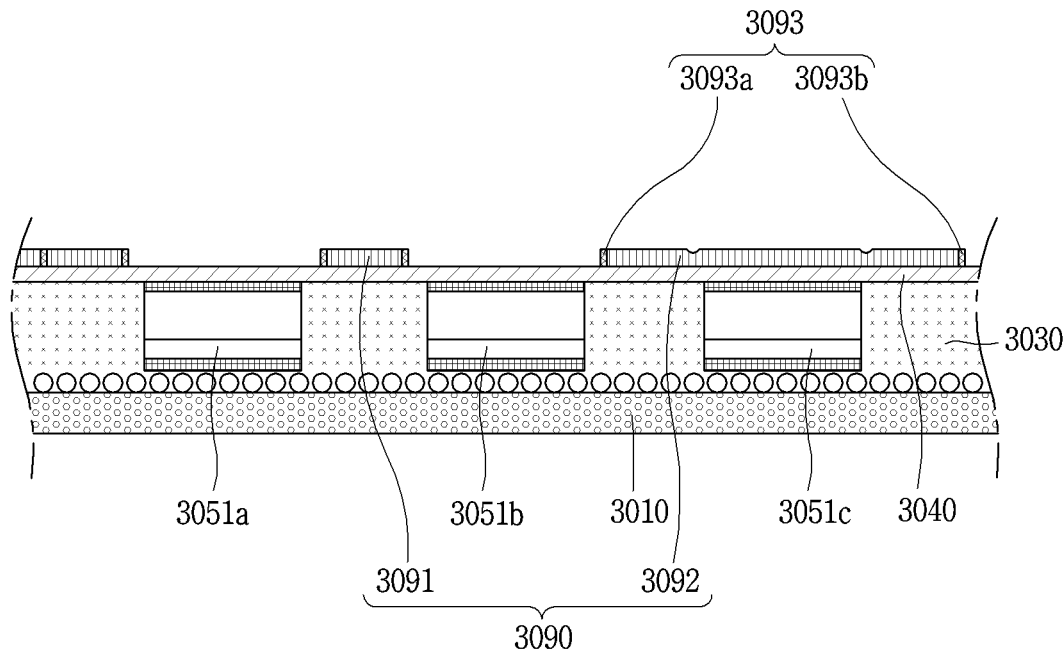

Then, at least part of the thin metal layer is removed to transmit light emitted from the semiconductor light emitting device to a portion corresponding to at least one of the plurality of semiconductor light emitting devices (refer to FIG. 19D).

In this case, the thin metal layer 3093 may be removed from an upper surface (the farthest surface from the semiconductor light emitting device) of the partition wall portion 3090, and in this case, an upper portion of the thin metal layer 3093 can be removed by dry etching to minimize an effect on the semiconductor light emitting device.

Figure 19E:
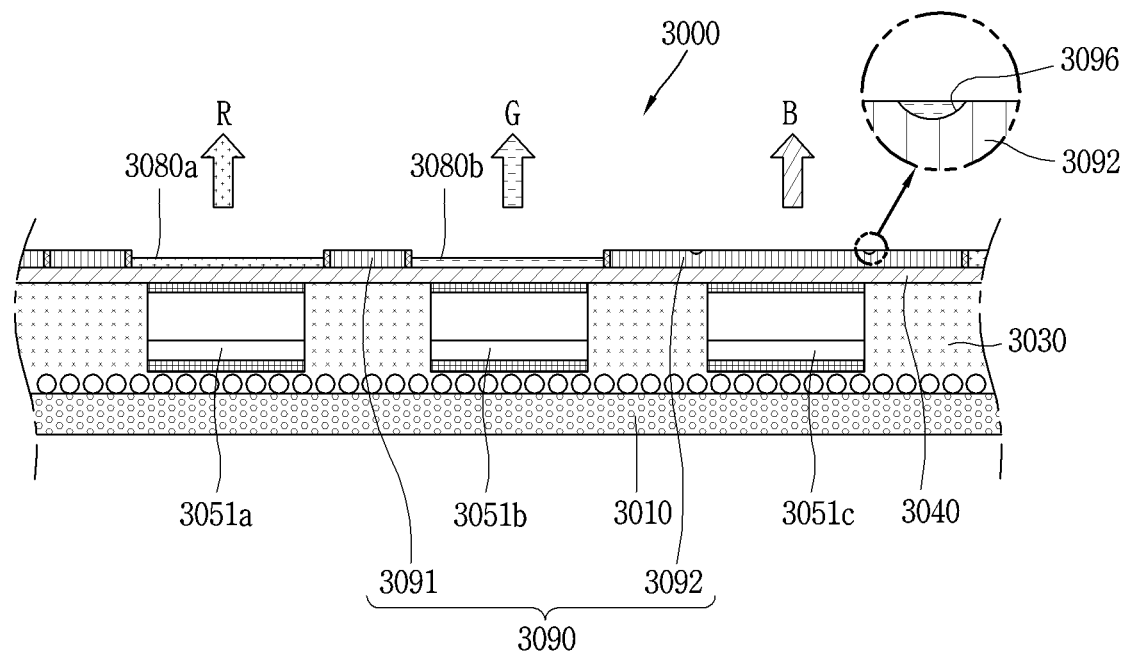

Next, as shown in FIG. 19E, the phosphor layer 3080 is formed by filling phosphor into a gap between the light transmitting materials on which the thin metal layer 3093 is deposited. In this case, the resin of the phosphor layer is filled in the groove 3096 arranged on an upper surface of the portion (LT2) arranged to cover at least one of the plurality of semiconductor light emitting devices. Furthermore, the resin may fill only part of a space between the thin metal layers to increase a thickness of the adhesive layer.

Figure 19F:
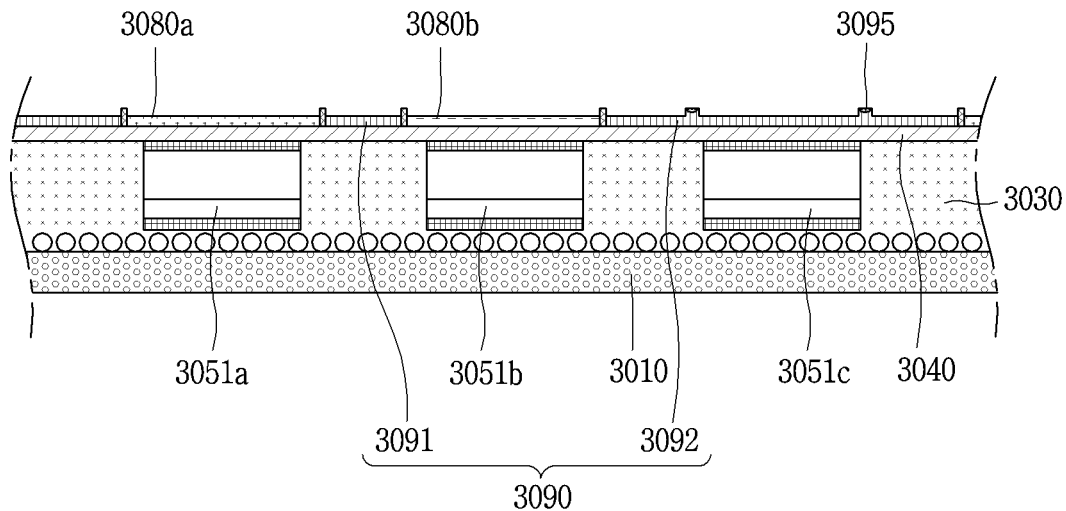

Then, as shown in FIG. 19F, only the partition wall portions are selectively etched through oxygen plasma etching. At this time, since the resin of the phosphor layer 3080 is not etched, the resin filled in the groove 3096 of the partition wall portion serves as a mask of the etching process.

Therefore, the reinforcing portion 3095 protruded toward the color filter (CF) may be formed on an upper surface of the light transmitting material 3094. Moreover, the reinforcing portion 3095 is protruded from an upper surface of the light transmitting material 3094 provided in the second partition wall portion toward the color filter (CF), and the reinforcing portion 3095 is not disposed on the first partition wall portion.

Figure 19G:
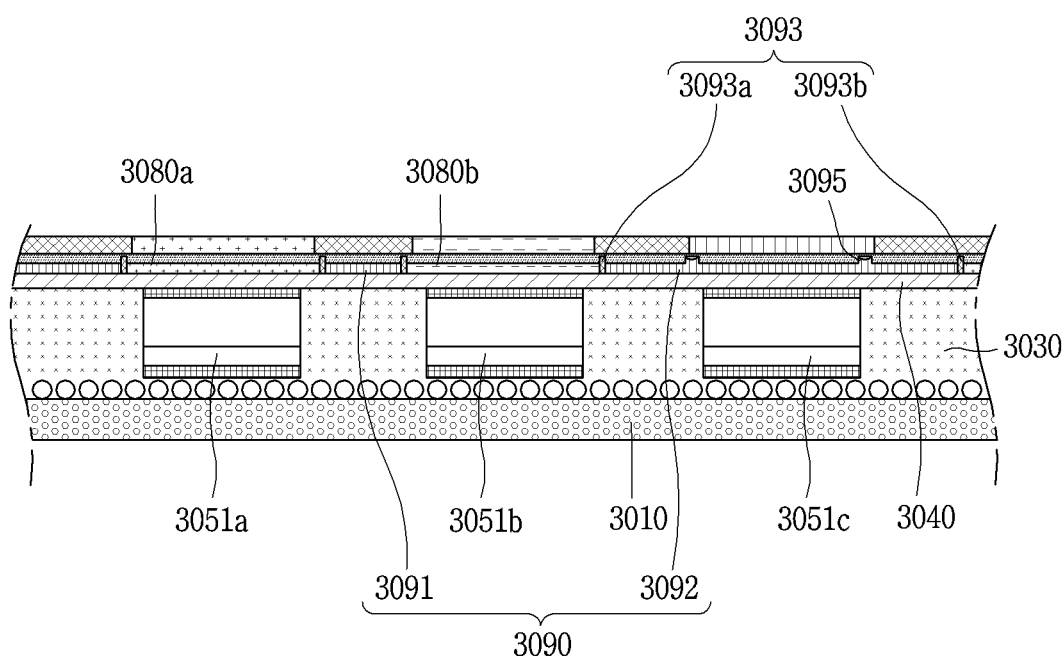

Finally, the color filter (CF) is adhered to the wavelength conversion layer (WL) using an adhesive material of the adhesive layer (BL) (FIG. 19G). The wavelength conversion layer (WL) may be combined with the color filter (CF) to realize the unit pixels of red, green, and blue, and may compensate the weakening of an adhesive force due to a difference in physical properties between a methyl-based Si-based material used as a resin of the phosphor layer 3080 and an acrylic-based resin.

The configurations and methods according to the above-described embodiments will not be applicable in a limited way to the foregoing display apparatus using a semiconductor light emitting device, and all or part of each embodiment may be selectively combined and configured to make various modifications thereto.

What is claimed is:

1. A display apparatus, comprising:
a substrate on which wiring electrodes are formed;
a plurality of semiconductor light emitting devices electrically connected to the wiring electrodes;
a wavelength conversion layer provided with a plurality of phosphor layers that convert a wavelength of light and a plurality of partition wall portions formed between the plurality of phosphor layers, and disposed to cover the plurality of semiconductor light emitting devices;
a color filter disposed to cover the wavelength conversion layer; and
an adhesive layer disposed between the color filter and the wavelength conversion layer,
wherein at least one of the plurality of partition wall portions comprises thin metal layers and a light transmitting material disposed in a space between the thin metal layers, and the adhesive layer is formed to fill at least part of the space between the thin metal layers, and
wherein the light transmitting material is formed at a height lower than that of the thin metal layers.

2. The display apparatus of claim 1, wherein a reinforcing portion protruded toward the color filter is formed on an upper surface of the light transmitting material to reinforce a coupling force between the color filter and the wavelength conversion layer.

3. The display apparatus of claim 2, wherein a recess groove is formed in the reinforcing portion.

4. The display apparatus of claim 3, wherein the recess groove has a curved surface concavely formed toward the semiconductor light emitting devices.

5. The display apparatus of claim 3, wherein at least one of the phosphor layers is configured to mix phosphor into a resin, and the recess groove is filled with the resin.

6. The display apparatus of claim 5, wherein the resin is configured not to be etched by a material for etching the light transmitting material.

7. The display apparatus of claim 2, wherein the reinforcing portion is one of a first reinforcing portion and a second reinforcing portion spaced apart from each other on the upper surface.

8. The display apparatus of claim 7, wherein a gap between the first reinforcing portion and the second reinforcing portion is 1.5 to 5 times a thickness of the reinforcing portion.

9. The display apparatus of claim 2, wherein the reinforcing portion comprises a plurality of cylinders.

10. The display apparatus of claim 9, wherein a diameter of the cylinders is equal to or smaller than a size of the phosphor of the phosphor layers.

11. The display apparatus of claim 9, wherein a pair of the cylinders are arranged sequentially in one direction to form two rows.

12. The display apparatus of claim 1, wherein at least part of the light transmitting material is covered by a resin of the phosphor layers.

13. The display apparatus of claim 12, wherein the resin covering at least part of the light transmitting material overlaps with the adhesive layer.

14. The display apparatus of claim 1, wherein at least one of the phosphor layers is configured to mix phosphor into a resin, and the resin is formed at a height lower than that of the thin metal layers.

15. The display apparatus of claim 14, wherein the resin is formed at a height higher than that of the light transmitting material.

16. The display apparatus of claim 1, wherein the plurality of partition wall portions comprises a first partition wall portion disposed to cover between the plurality of semiconductor light emitting devices, and a second partition wall portion configured to cover at least one of the plurality of semiconductor light emitting devices.

17. The display apparatus of claim 16, wherein a reinforcing portion protruded toward the color filter is formed on an upper surface of a light transmitting material provided on the second partition wall portion, and the reinforcing portion is not disposed on the first partition wall portion.

* * * * *